United States Patent
Osako

(10) Patent No.: US 12,446,423 B2
(45) Date of Patent: Oct. 14, 2025

(54) SELF-LUMINOUS DISPLAY PANEL AND SELF-LUMINOUS DISPLAY PANEL MANUFACTURING METHOD

(71) Applicant: Magnolia Blue Corporation, Tokyo (JP)

(72) Inventor: Takashi Osako, Tokyo (JP)

(73) Assignee: MAGNOLIA BLUE CORPORATION, Tokyo (JP)

( * ) Notice: Subject to any disclaimer, the term of this patent is extended or adjusted under 35 U.S.C. 154(b) by 625 days.

(21) Appl. No.: 17/701,672

(22) Filed: Mar. 23, 2022

(65) Prior Publication Data

US 2022/0310774 A1 Sep. 29, 2022

(30) Foreign Application Priority Data

Mar. 25, 2021 (JP) ................. 2021- 051782

(51) Int. Cl.
| | |
|---|---|
| *H10K 59/131* | (2023.01) |
| *H10K 50/86* | (2023.01) |
| *H10K 59/122* | (2023.01) |
| H10K 59/80 | (2023.01) |

(52) U.S. Cl.
CPC ....... *H10K 59/1315* (2023.02); *H10K 50/865* (2023.02); *H10K 59/122* (2023.02); *H10K 59/8792* (2023.02)

(58) Field of Classification Search
CPC ............. H10K 59/1315; H10K 50/865; H10K 59/122; H10K 59/8792; H10K 59/1201; H10K 59/38
See application file for complete search history.

(56) References Cited

U.S. PATENT DOCUMENTS

| 2006/0078830 A1* | 4/2006 | Hirai | H10D 86/00 |
|---|---|---|---|
| | | | 257/E27.111 |
| 2010/0213438 A1 | 8/2010 | Cho et al. | |
| 2020/0006661 A1 | 1/2020 | Shinokawa et al. | |

(Continued)

FOREIGN PATENT DOCUMENTS

| CN | 111418266 A | 7/2020 |
|---|---|---|
| JP | 2007103098 A | 4/2007 |

(Continued)

OTHER PUBLICATIONS

Office Action in JP Application No. 2021-051782, mailed Nov. 26, 2024. 6pp.

*Primary Examiner* — Kevin Quarterman
(74) *Attorney, Agent, or Firm* — HAUPTMAN HAM, LLP

(57) ABSTRACT

A display panel including auxiliary wiring on a substrate, pixel electrodes in a matrix above the substrate with gaps between the pixel electrodes, light emitting layers above the pixel electrodes, a functional layer above and continuous across the light emitting layers, and a common electrode above and continuous across the functional layer. The auxiliary wiring extends in plane directions of a main surface of the substrate below the pixel electrodes. Above the substrate, connection areas CA exist where the pixel electrodes are not present, in which the common electrode and the auxiliary wiring are electrically connected to each other. In plan view, portions of outer edges of the pixel electrodes facing outer edges of the connection areas CA are recessed inwards of the pixel electrodes.

10 Claims, 17 Drawing Sheets

(56) References Cited

U.S. PATENT DOCUMENTS

| | | |
|---|---|---|
| 2020/0357863 A1 | 11/2020 | Nakamura et al. |
| 2021/0183963 A1* | 6/2021 | Jang ..................... H10K 59/353 |
| 2021/0273195 A1* | 9/2021 | Lee ..................... H10K 50/865 |
| 2022/0131104 A1* | 4/2022 | Kim ..................... H10K 59/123 |
| 2022/0415993 A1* | 12/2022 | Ryu ..................... H01L 27/124 |
| 2023/0109576 A1* | 4/2023 | Uchida ................ H10K 50/852 |
| | | 257/89 |

FOREIGN PATENT DOCUMENTS

| | | |
|---|---|---|
| JP | 2010199067 A | 9/2010 |
| JP | 2018-129265 A | 8/2018 |
| JP | 20209676 A | 1/2020 |
| WO | 2010/070798 A1 | 6/2010 |

\* cited by examiner

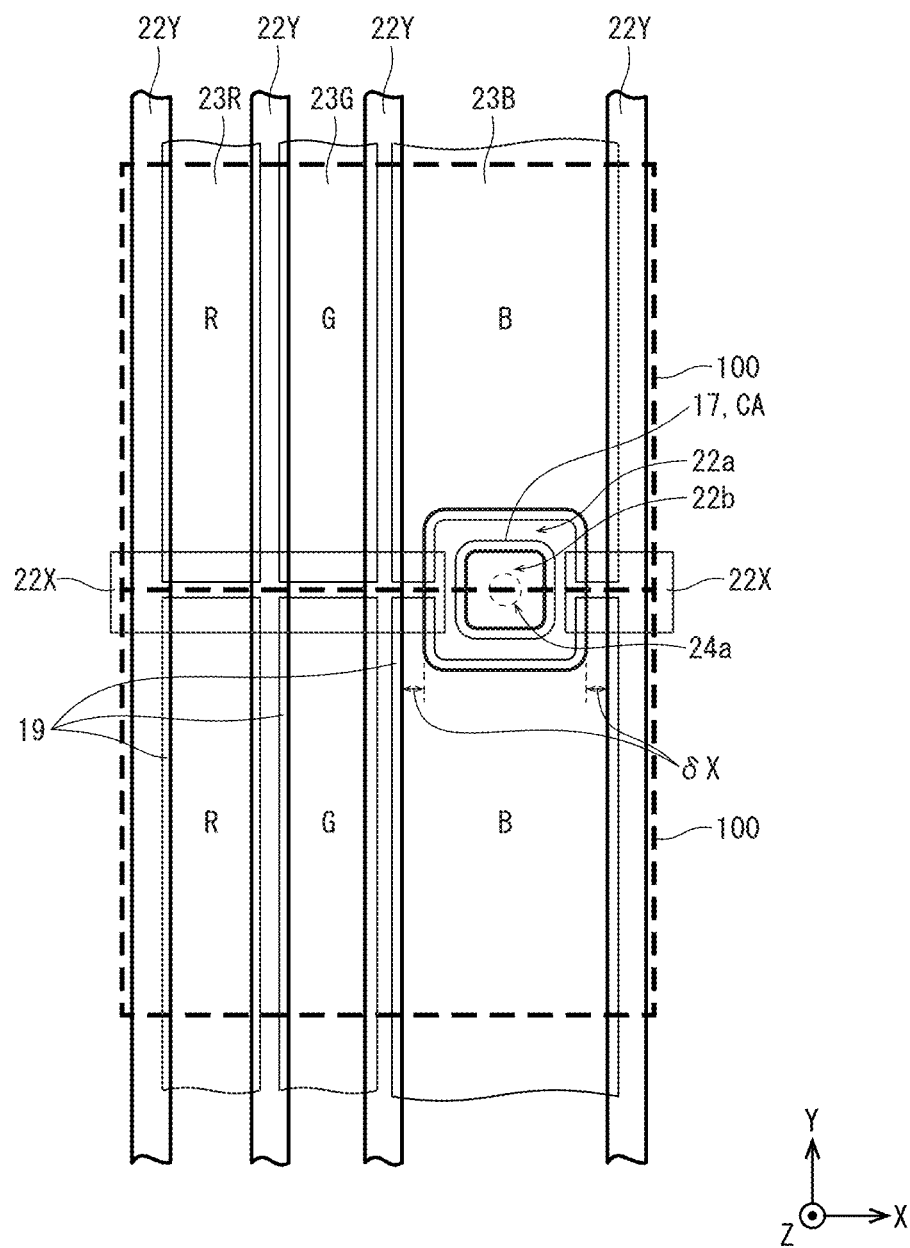

SELF-LUMINOUS DISPLAY PANEL AND SELF-LUMINOUS DISPLAY PANEL MANUFACTURING METHOD

This application claims priority to Japanese Patent Application No. 2021-051782 filed Mar. 25, 2021, the contents of which are hereby incorporated by reference in their entirety.

BACKGROUND

Technical Field

The present disclosure relates to a self-luminous display panel and a method for manufacturing a self-luminous display panel.

Description of Related Art

Organic electroluminescence (EL) display panels including organic EL elements are conventionally known. An organic EL element has a multi-layer structure in which thin films of various materials are laminated, and includes at least an organic light emitting layer sandwiched between a pixel electrode and a common electrode, all above a thin film transistor (TFT) substrate covered by a planarizing insulation layer.

The organic EL element emits light when a voltage is applied between the pixel electrode and the common electrode, and holes and electrons injected into the light emitting layer recombine. In a top-emission type of organic EL element, light from the light emitting layer is reflected by a pixel electrode made of a light reflective material and is emitted upward from a common electrode made of a light transmissive material. The common electrode is often formed over an entire surface of a substrate, and is electrically connected to a power supply that supplies a current to the organic EL element via an electrode plate provided in a peripheral area other than an image display area.

In recent years, an increase in display panel sizes has led to an increase in power supply paths and a corresponding increase in electrical resistance of the common electrode, and portions of the common electrode that are far from power supply are insufficiently supplied, lowering luminance efficiency and leading to a problem of uneven brightness.

In response to this, JP 2007-103098 and JP 2020-9676, for example, describe auxiliary wiring disposed in a long shape in gaps between pixel electrodes on the substrate, removal of a portion of a functional layer disposed above the auxiliary wiring, then film forming the common electrode facing the pixel electrodes, and this secures electrical contact between the auxiliary wiring and the common electrode, thereby reducing electrical resistance of the common electrode to suppress uneven brightness.

SUMMARY

A self-luminous display panel pertaining to an aspect of the present disclosure is a self-luminous display panel including a substrate, auxiliary wiring disposed on the substrate, pixel electrodes disposed in a matrix of rows and columns above the substrate with defined gaps between the pixel electrodes, light emitting layers disposed above the pixel electrodes, a functional layer disposed above the light emitting layers, the functional layer being continuous across the light emitting layers, and a common electrode disposed above the functional layer, the common electrode being continuous across the functional layer. The auxiliary wiring extends in plane directions of a main surface of the substrate below the pixel electrodes. Above the substrate, connection areas exist where the pixel electrodes are not present, in which the common electrode and the auxiliary wiring are electrically connected to each other. In plan view, portions of outer edges of the pixel electrodes facing outer edges of the connection areas are recessed inwards of the pixel electrodes.

BRIEF DESCRIPTION OF DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 16 is a schematic plan view enlargement of pixels of an organic EL display panel according to modification 4.

DETAILED DESCRIPTION

Figure 1:
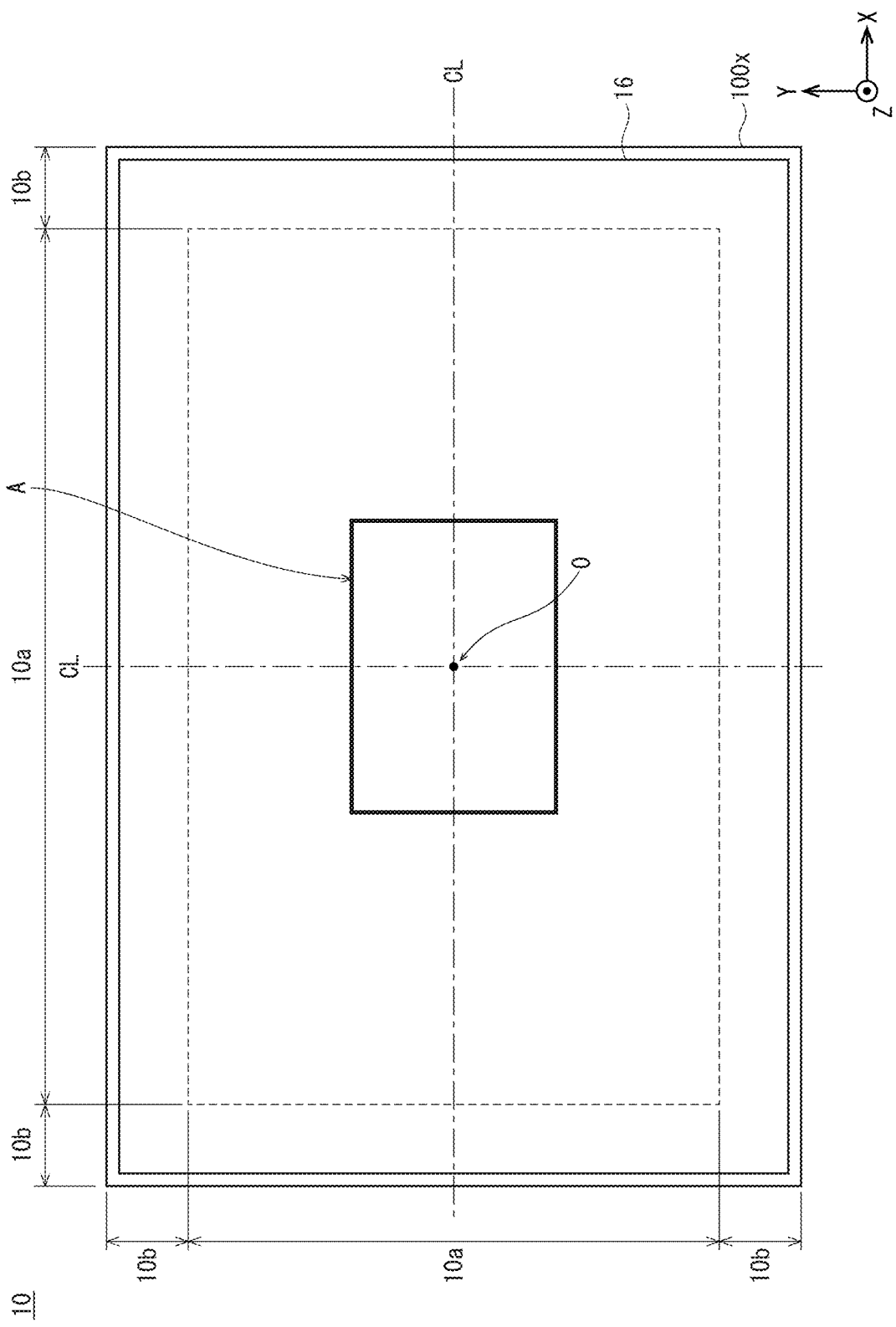
FIG. 1 is a plan-view diagram of display panel 10 according to at least one embodiment.

Background to an Aspect of the Disclosure

Conventionally, the cross-section area of auxiliary wiring required increases as a display panel becomes larger, and therefore there is a problem with the conventional display panel structure described in JP 2007-103098 and JP 2020-9676 that an aperture ratio of the display panel decreases along with the increase in auxiliary wiring.

The present disclosure is made in view of the above problems, and an object of the present disclosure is to provide a self-luminous display panel and a method for manufacturing same, in which a decrease in aperture ratio caused by provision of auxiliary wiring is suppressed, and resistance of a power supply path to a light emitting element is reduced, thereby helping to reduce in-plane brightness variation caused by voltage drop, where the aperture ratio is a ratio of a self-luminous area to the area of a face of the display panel.

An organic EL display panel pertaining to at least one aspect of the present disclosure is a self-luminous display panel including a substrate, auxiliary wiring disposed on the substrate, pixel electrodes disposed in a matrix of rows and columns above the substrate with defined gaps between the pixel electrodes, light emitting layers disposed above the pixel electrodes, a functional layer disposed above the light emitting layers, the functional layer being continuous across the light emitting layers, and a common electrode disposed above the functional layer, the common electrode being continuous across the functional layer. The auxiliary wiring extends in plane directions of a main surface of the substrate below the pixel electrodes. Above the substrate, connection areas exist where the pixel electrodes are not present, in which the common electrode and the auxiliary wiring are electrically connected to each other. In plan view, portions of outer edges of the pixel electrodes facing outer edges of the connection areas are recessed inwards of the pixel electrodes.

According to this structure, in the display panel, the auxiliary wiring extends in the plane directions of the main surface of the substrate below the pixel electrodes and therefore even if area of the auxiliary wiring is increased, a decrease in area of a self-luminous area in an image display area can be suppressed, unlike in a conventional display panel where an increase in area of the auxiliary wiring is connected to a decrease in area of the self-luminous area.

Further, in plan view, the outer edge portions of the pixel electrodes facing the outer edges of the connection areas are recessed inwards of the pixel electrodes. That is, a structure is adopted such that the pixel electrodes around the connection areas avoid the connection areas by being recessed so as to be separated from the connection areas by a defined distance in plan view. As a result, dark areas that do not emit light due to the connection areas are dispersed and arranged at boundaries between light emitting areas, and are therefore less noticeable. When connection areas are linearly arranged in rows or columns as in a conventional display panel, connection areas can be recognized as continuous linear dark areas that do not emit light. In contrast, according to at least one embodiment, a ratio of area of the self-luminous area that is reduced by the connection areas is reduced, and dark areas that do not emit light due to the connection areas are dispersed to be scattered between light emitting areas, and therefore a degree of reduction in display area visible to a viewer is also reduced.

As described above, the display panel suppresses a decrease in aperture ratio, which is a ratio of self-luminous area to area of the display panel, caused by the provision of the auxiliary wiring, while also reducing resistance of current supply paths to light emitting elements, and therefore it is possible to implement an organic EL display panel that ameliorates in-plane luminance variation due to voltage drop.

Further, according to at least one embodiment, portions of the functional layer above the connection areas are removed to create openings, and the common electrode is in contact with the auxiliary wiring or electrodes or a layer electrically connected to the auxiliary wiring exposed by the openings in the functional layer.

According to this structure, portions of the functional layer are removed and the common electrode is in contact with the auxiliary wiring or electrodes or a layer electrically connected to the auxiliary wiring so that the common electrode and the auxiliary wiring can be electrically connected, making it possible to realize an organic EL display panel structure that suppresses a decrease in aperture ratio caused by the auxiliary wiring as well as reducing resistance of power supply paths to light emitting elements.

Further, according to at least one embodiment, the self-luminous display panel further includes column banks disposed above gaps between the pixel electrodes, the column banks extending in a column direction and arranged side by side. The auxiliary wiring extends in a row direction and/or the column direction in plan view of the substrate. The light emitting layers are disposed in gaps between the column banks so as to be continuous in any given gap above a plurality of the pixel electrodes. Some or all of the column banks include widened portions that include the connection areas in plan view. The widened portions each have a shape in which an opening is provided that penetrates through the widened portion in a height direction and includes one of the openings of the functional layer in plan view.

Further, according to at least one embodiment, the self-luminous display panel further includes row banks disposed above gaps between the pixel electrodes, the row banks extending in the row direction, arranged side by side, and connected to the column banks, wherein the row banks are connected to the widened portions of the column banks.

According to this structure, an amount of inwards recession of the pixel electrodes in the portions of the outer edges of the pixels electrodes facing the outer edges of the connection areas needed to avoid the connection areas can be made smaller. As a result, an area of the self-luminous area of each sub-pixel can be increased.

Further, according to at least one embodiment, the self-luminous display panel further includes row banks disposed above gaps between the pixel electrodes, the row banks extending in the row direction, arranged side by side, and connected to the column banks, wherein the row banks are connected to the column banks in the vicinity of the widened portions, and the row banks are in contact with the widened portions in the column direction.

According to this structure, shortening of length of the row banks due to presence of the connection areas can be prevented, and in forming the light emitting layers, length in the row direction of ink that comes into contact with the row banks in formation of sub-pixels in sub-pixel columns can be increased, which can increase uniformity of light emitting layer film thickness in sub-pixels. As a result luminance variation among sub-pixels can be ameliorated.

Further, according to at least one embodiment, the widened portions of the column banks are arranged in the column direction at a pitch larger than a pitch of the pixel electrodes.

According to this structure, the number of sub-pixels having a shortened length of row bank due to presence of the connection areas can be reduced in a sub-pixel column, and in forming the light emitting layers, uniformity of light emitting layer film thicknesses can be relatively improved between sub-pixels in the sub-pixel columns CB.

Further, according to at least one embodiment, among the column banks that include widened portions, positions of the widened portions in the column direction are different for any two of the column banks that are adjacent to each other in the row direction. Further, according to at least one embodiment, positions of the widened portions in the column direction are the same for any two of the column banks that include widened portions and sandwich in the row direction another one of the column banks that includes widened portions.

According to this structure, positions in the column direction where the connection areas exist are staggered, alternating depending on position in the row direction, and therefore reductions in luminance due to connection areas in the image display area are dispersed and are difficult to recognize as streaks.

Further, according to at least one embodiment, the self-luminous display panel further includes row banks disposed above gaps between the pixel electrodes, the row banks extending in the row direction, arranged side by side, and connected to the column banks, wherein in plan view, the connection areas overlap with the row banks and are separated from the column banks by at least a defined distance.

According to this structure, in forming the light emitting layers, flow of ink in the column direction of the sub-pixel columns is increased by the ink being brought into contact with row banks on both sides of the connection areas in formation of sub-pixels in the sub-pixel columns CB, and uniformity of film thickness of the light emitting layers between sub-pixels in the sub-pixel columns can be relatively improved. This makes it possible to ameliorate luminance variation between sub-pixels in sub-pixel columns.

Further, according to at least one embodiment, the self-luminous display panel further includes a light shielding layer disposed above and covering the gaps between the pixel electrodes, wherein the light shielding layer includes widened portions covering the connection areas in plan view.

According to this structure, the connection areas are covered by the widened portions of the light shielding layer, and therefore upwards reflection of external light by the connecting electrodes can be suppressed, and glare caused by reflection of external light can be ameliorated.

According to at least one embodiment, in plan view, outer edges of the pixel electrodes around the connection areas are arranged to face the outer edges of the connection areas in the row direction and the column direction.

Further, an organic EL display panel manufacturing method pertaining to an aspect of the present disclosure is a self-luminous display panel manufacturing method including preparing a substrate with auxiliary wiring extending in plane directions of a main surface of the substrate, forming pixel electrodes arranged in a matrix of rows and columns above the substrate with defined gaps between the pixel electrodes, a portion of the pixel electrodes being disposed above the auxiliary wiring and leaving defined areas above the auxiliary wiring where the pixel electrodes are not present, forming light emitting layers above the pixel electrodes, forming a functional layer above the light emitting layers to be continuous across the light emitting layers, removing portions of the functional layer above the defined areas to expose portions of the auxiliary wiring or electrodes or a layer electrically connected to the auxiliary wiring, and forming a common electrode above the functional layer, to be continuous across the functional layer, so that portions of the common electrode and the auxiliary wiring, or the electrodes or the layer, are in contact with each other. In the forming of the pixel electrodes, in plan view, portions of outer edges of the pixel electrodes facing outer edges of the defined areas are recessed inwards of the pixel electrodes.

According to this method, portions of the functional layer are removed and the common electrode is made to be in contact with the auxiliary wiring or electrodes or a layer electrically connected to the auxiliary wiring so that the common electrode and the auxiliary wiring can be electrically connected, making it possible to realize a method of manufacturing an organic EL display panel that suppresses a decrease in aperture ratio caused by the auxiliary wiring as well as reducing resistance of power supply paths to light emitting elements.

Further, according to at least one embodiment, the method further includes forming column banks above gaps between the pixel electrodes to extend in a column direction and be arranged side by side. The light emitting layers are formed in gaps between the column banks so as to be continuous in any given gap above a plurality of the pixel electrodes, some or all of the column banks are formed to include widened portions that include openings that overlap with the defined areas in plan view, and in the removing of the portions of the functional layer, the portions of the functional layer are removed in the openings.

Embodiments

The following is a description of a self-luminous panel according to an aspect of the present disclosure, and a method for manufacturing the same, described with reference to the drawings. The drawings may be schematic, and are not necessarily to scale.

Overall Structure of Display Panel 10

An organic EL display panel 10 (hereinafter also referred to as "display panel 10") according to at least one embodiment is a top emission type of display panel, in which organic EL elements 2 are arranged across an image display surface, and light emission of organic EL elements is combined to display an image.

(A) Plan View Structure

Figure 2:
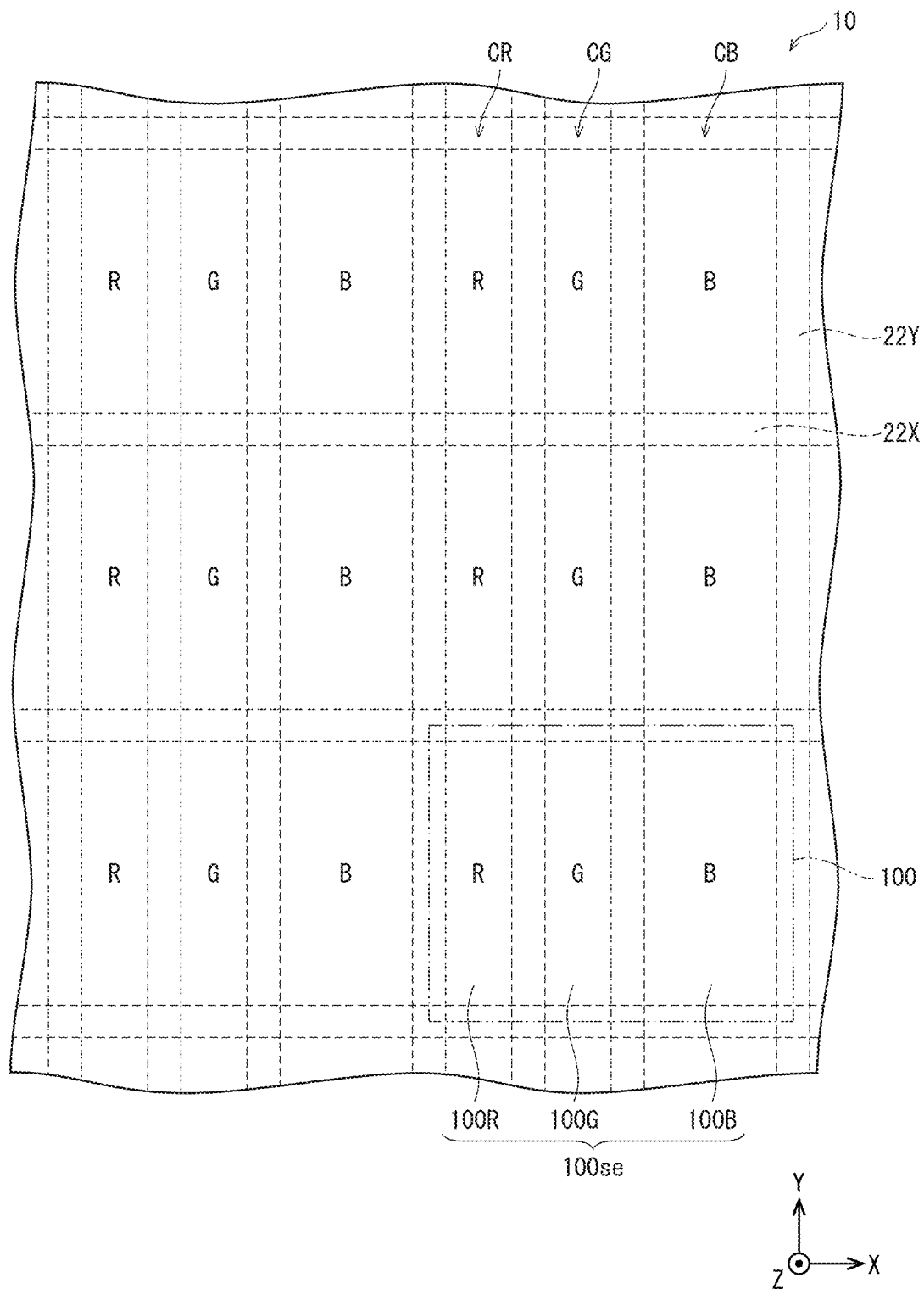
FIG. 2 is a schematic plan view enlargement of area A of an image display area of display panel 10.

FIG. 1 is a plan-view diagram of the display panel 10 according to at least one embodiment. FIG. 2 is a schematic plan view enlargement of area A of an image display area of the display panel 10. Here, in the present description, the X direction, Y direction, and Z direction in the drawings represent a row direction, column direction, and thickness direction of the display panel 10, respectively.

In an organic EL display panel that utilizes electroluminescence of organic material, on an upper surface of a planarizing layer 16 disposed on a substrate 100x on which a thin film transistor (TFT) is formed (TFT substrate), pixels 100 are arranged in a matrix, for example. As illustrated, the display panel 10 in plan view is divided into an image display area 10a corresponding to a defined area including a center O of a face of a substrate 100x and a peripheral area 10b around the periphery of the image display area 10a of the substrate 100x.

In the display panel 10, as an example, sub-pixels 100R, 100G, 100B (hereinafter, also collectively referred to as "sub-pixels 100se") that emit red (R), green (G), blue (B) light, respectively, are arranged in a matrix. The sub-pixels 100R, 100G, 100B repeat in this sequence in the X direction, and each set of the sub-pixels 100R, 100G, 100B constitute a pixel 100. In the pixel 100, full color can be expressed by combining emitted luminance of the sub-pixels 100R, 100G, 100B whose gradation is controlled.

Further, in the Y direction, a sub-pixel column CR consists of sub-pixels 100R, a sub-pixel column CG consists of sub-pixels 100G, and a sub-pixel column CB consists of sub-pixels 100B. As a result, pixels P of the display panel 10 are arranged in a matrix along the X and Y directions, and an image is displayed on the image display surface by combining colors of the pixels 100 arranged in the matrix.

Further, the display panel 10 according to at least one embodiment uses a line bank structure. That is, column banks 22Y arranged at intervals in the X direction partition the sub-pixel columns CR, CG, CB, and in each of the sub-pixel columns CR, CG, CB is a single organic light emitting layer shared across a plurality of sub-pixels 100R, 100G, 100B, respectively.

However, in each of the sub-pixel columns CR, CG, CB, multiple row banks 22X are arranged at intervals in the Y direction to insulate the sub-pixels 100R, 100G, or 100B from each other, so that each of the sub-pixels 100R, 100G, 100B can emit light independently.

Figure 3:
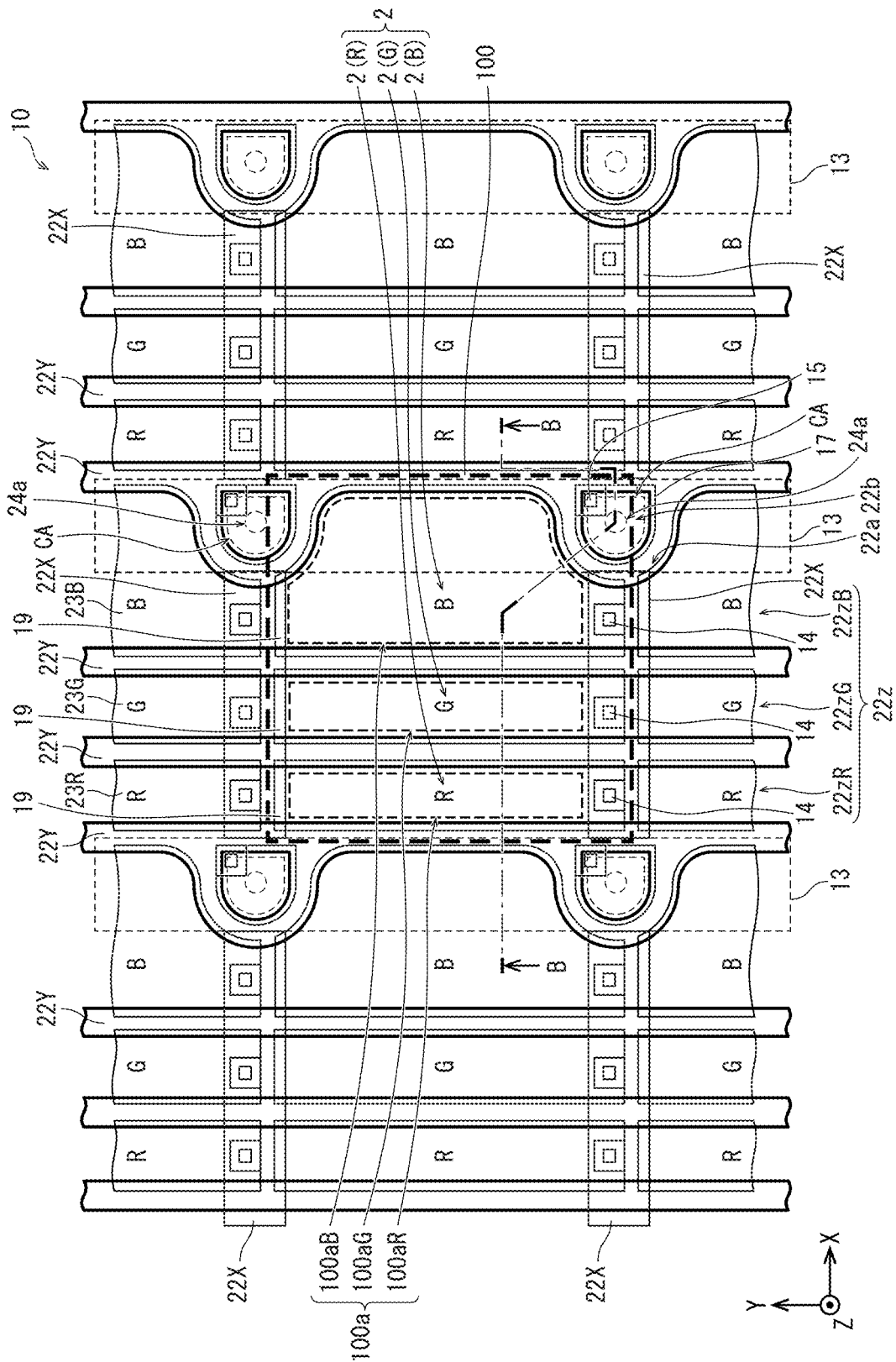
FIG. 3 is a schematic plan view enlargement of pixels of display panel 10.

FIG. 3 is an enlarged schematic plan view of a plurality of the pixels 100 of the display panel 10, and is a plan view from a viewpoint below the column banks 22Y, which are described later.

As illustrated in FIG. 3, the pixels 100 of the display panel 10 are unit pixels in a color display, and in an area partitioned by the column banks 22Y and the row banks 22X into a matrix, each of the pixels 100 is a group of sub-pixels 100R, 100G, 100B corresponding to a group of organic EL elements 2(R), 2(G), 2(B) (hereinafter also referred to as "organic EL elements 2") that have red, blue, and green light emitting self-luminous areas 100aR, 100aG, 100aB (hereinafter also referred to as "self-luminous areas 100a").

When a gap between a pair of adjacent column banks 22Y is defined as a gap 22z, and gaps corresponding to self-luminous areas 100aR, 100aG, 100aB are defined as gaps 22zR, 22zG, 22zB, respectively, then in the gaps 22zR, 22zG, 22zB, light emitting layers 23R, 23G, 22B that emit RGB color light in the self-luminous areas 100aR, 100aG, 100aG are continuous in the column direction.

In the display panel 10, pixel electrodes 19 made of light reflective material that correspond to the self-luminous areas 100aR, 100aG, 100aB of the sub-pixels 100R, 100G, 100B are arranged in a matrix separated from each other by a defined distance in the row and column directions.

Each of the pixel electrodes 19 has, in plan view, a rectangular shape or substantially rectangular shape in which a portion of an outer edge is recessed inward. According to at least one embodiment, among the sub-pixels 100R, 100G, 100B, length in the row direction of the pixel electrodes corresponding to the sub-pixels 100B is greater than length in the row direction of the pixel electrodes corresponding to the sub-pixels 100R, 100G, and the self-luminous areas 100aB are larger than the self-luminous areas 100aR, 100aG.

Further, in areas where the pixel electrodes are covered by the row banks 22X, connecting electrode recesses 14 are provided in contact holes 16a of the planarizing layer 16 that electrically connect the pixel electrodes 19 to TFT sources $S_1$.

Further, as illustrated in FIG. 3, in the display panel 10, auxiliary wiring 13 extends continuously in the TFT layer 12 in the column direction across the image display area 10a of the substrate 100x.

Above the substrate 100x (according to at least one embodiment, on a surface of the planarizing layer 12), there are none of the pixel electrodes 19 in connection areas CA for electrically connecting the common electrode 25 to the auxiliary wiring 13. A connecting electrode 17 (hereinafter also referred to simply as an "electrode") for ensuring an electrical connection between the auxiliary wiring 13 and the common electrode 25 is disposed in each of the connection areas CA. The connecting electrode 17 is provided with a connecting electrode recess 15 that electrically connects the connecting electrode 17 and the auxiliary wiring 13 to a contact hole 16b of the planarizing layer 16. Size of the connecting electrode 17 may be determined according to the sub-pixel 100se, for example in a range including a circle having a diameter of 20 μm.

According to at least one embodiment, as illustrated in FIG. 3, connection areas CA are formed at boundaries between adjacent sub-pixels 100B in the vicinity of one of the column banks 22Y on either side of the gaps 22zB (in this example, the column banks 22Y that separate the gaps 22zB from the gaps 22zR). By providing the connection areas CA to the sub-pixels 100B, which have larger self-luminous areas 100aB than other sub-pixels, a rate of reduction in area of the self-luminous areas 100a can be reduced when compared with providing the connection areas CA to the sub-pixels 100R, 100G.

The pixel electrodes 19 around the connection areas CA are, in plan view, formed to be separated from the connection areas CA by a defined distance to avoid contact, and a portion of outer edges of the pixel electrodes 19 facing outer edges of the connection areas CA are recessed inwards of the pixel electrodes 19. Alternatively, outer edges of the pixel electrodes 19 around the connection areas CA are arranged to face outer edges of the connection areas CA in the row direction and the column direction.

Widened portions 22a including the connection areas CA in plan view are formed in the column banks 22Y above the substrate 100x. Each of the widened portions 22a has a shape provided with an opening 22b that penetrates through in the height direction, and in plan view the connecting electrodes 17 overlap with the through holes 22b.

According to at least one embodiment, as described above, the row banks 22X, which insulate adjacent sub-pixels 100R, 100G, 100B in the column direction, are arranged at intervals in the Y direction, and therefore the row banks 22X are connected to the widened portions 22a of the column banks 22Y in the sub-pixel columns CB. With this structure, the amount of recessing towards the inside of the pixel electrodes 19 of portions of the outer edges of the pixel electrodes 19 facing the outer edges of the connection areas CA in order to avoid the connection areas CA can be made relatively small, such that area of the self-luminous areas 100aB in the sub-pixels 100B can be made relatively large.

As described later, the hole transport layers 21 and the light emitting layers 23 selectively formed by an application method are not formed in the openings 22b of the column banks 22Y, while the hole injection layers 20, the electron injection transport layer 24, and the common electrode 25 are laminated in this order onto top surfaces of the connecting electrodes 17 in the openings 22b.

The electron injection transport layer 24 is formed with openings where portions of the electron injection transport layer 24 are missing in the openings 22b of the column banks 22Y. In the present description, the missing portions of the electron injection transport layer 24 are openings 24a. In other words, the column banks 22Y have shapes in which the openings 24a of the electron injection transport layer 24 are included in plan view in the openings 22b of the widened portions 22a of the column banks 22Y. Similarly, the hole injection layers 20 may each be formed with an opening where a portion of the hole injection layer 20 is missing, in the openings 22b of the column banks 22Y in plan view. Size of the openings 24a may be, for example, 6 µm or more in diameter. Further, a plurality of the openings 24a may be provided in each of the openings 22b.

According to this structure, the common electrode 25 is in contact with surfaces of the hole injection layers 20 or the connecting electrodes 17 exposed by the openings 24a of the electron injection transport layer 24, and electrical connection between the connecting electrodes 17 and the common electrode 25 is made possible. The common electrode 25 and the auxiliary wiring 13 are electrically connected to each other via the connecting electrodes 17 and the hole injection layers 20 provided in the connection areas CA.

(B) Cross Section Structure

FIG. 3 is a schematic cross section diagram of the display panel 10, following a line B-B in FIG. 2. In the display panel 10, one pixel consists of three sub-pixels that emit R, G, B light respectively, and the sub-pixels include the organic EL elements 2(R), 2(G), 2(B) that each emit a corresponding color.

As illustrated in FIG. 3, the organic EL elements 2 include the substrate 100x, the planarizing layer 16, the pixel electrodes (anodes) 19, the connecting electrodes 17, the row banks 22X, the column banks 22Y, the hole injection layers 20, the hole transport layers 21, the light emitting layers 23, the hole injection transport layer 24, the common electrode (cathode) 25, and the sealing layer 26. Of these, layers other than the light emitting layers 23 that are sandwiched between the pixel electrodes 19 and the common electrode 25, that is, the hole injection layers 20, the hole transport layers 21, and the electron injection transport layer 24, are referred to as functional layers of the organic EL elements 2.

The pixel electrodes 19, the hole injection layers 20, and the hole transport layers 21 are arranged to each continuously extend across a corresponding one of the gaps 22z in each of the sub-pixels 100R, 100G, 100B, while the electron injection transport layer 24, the common electrode 25, and the sealing layer 26 extend between the pixels 100 to cover the image display area 10a continuously.

Substrate

The substrate 100x includes a base 11 that is an insulating material and a thin film transistor (TFT) layer 12. The TFT layer 12 includes drive circuits, one for each sub-pixel. The base 11 is a support member of the display panel 10, and is a flat plate. As a material of the base 11, a material that has an electrical insulating property can be used, such as a glass material, a resin material, a semiconductor material, a metal material coated with an insulating layer, or the like.

In order to manufacture a flexible organic EL display panel, according to at least one embodiment the base 11 is a plastic material.

The TFT layer 12 includes TFTs formed on a top surface of the base 11 and wiring (connecting TFT sources $S_1$ to corresponding pixel electrodes 19). The TFTs electrically connect corresponding pixel electrodes 19 and an external power supply according to drive signals from an external circuit of the display panel 10, and each of the TFTs has a multilayer stricture including an electrode, a semiconductor layer, and an insulating layer. The wiring electrically connects the TFTs, the pixel electrodes 19, an external power supply, an external circuit, and the like, and pads 12a are formed below the pixel electrodes 19 on the top surface of the TFT layer 12.

Further, auxiliary wiring 13 that extends in the row and/or column direction in plan view is arranged above the substrate 100x (in this example, above the planarizing layer 12). The auxiliary wiring 13 may be arranged on a top surface of the TFT layer 12, for example. The auxiliary wiring 13 is an auxiliary electrode layer for reducing electrical resistance of the common electrode 25 by making electrical connections with the common electrode 25 through the openings 24a in the electron injection transport layer 24.

Figure 4:
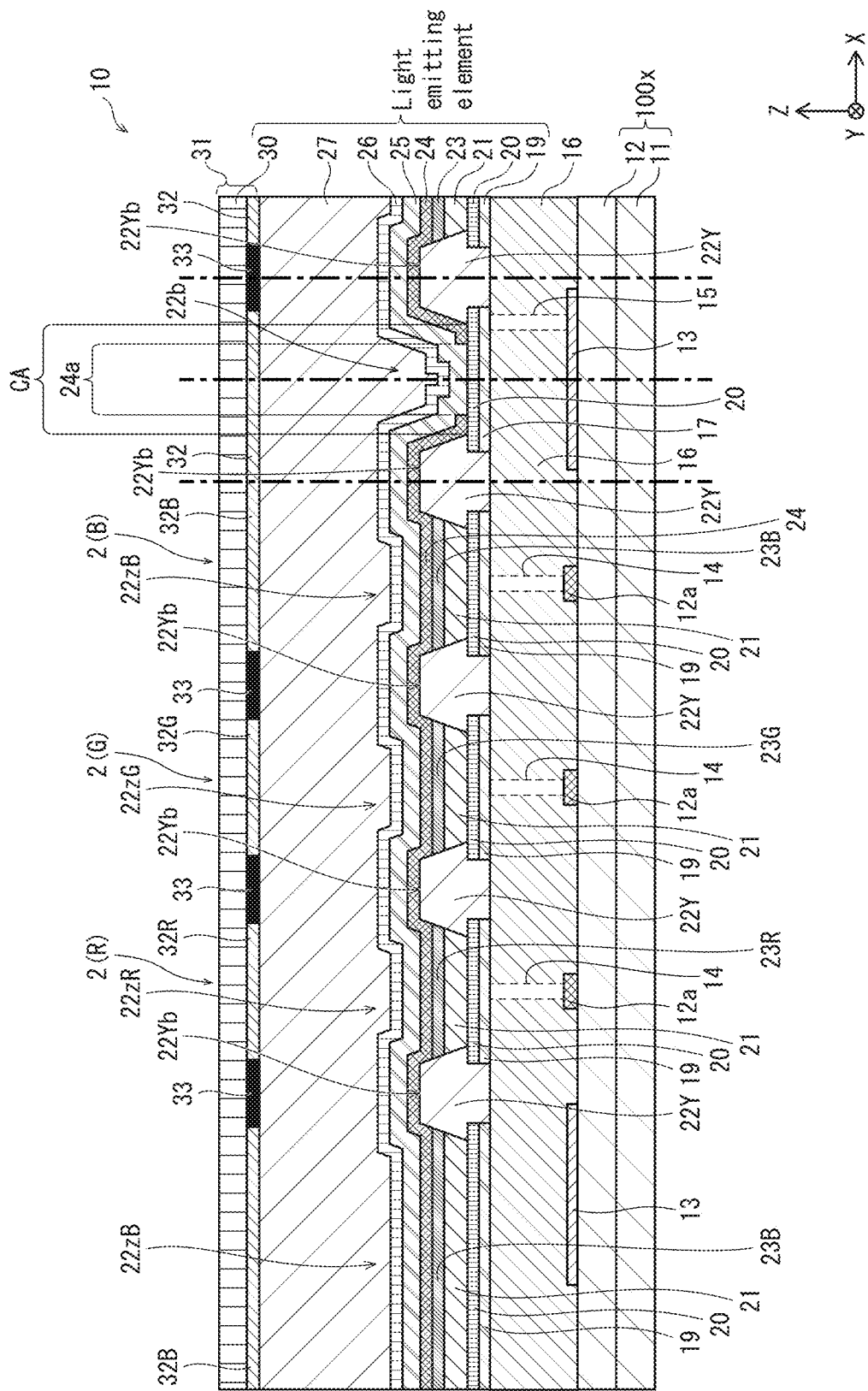
FIG. 4 is a schematic diagram of a cross section of display 10 taken along line B-B in FIG. 3.

The auxiliary wiring 13 may be extended and arranged so as to cover the image display area 10a of the substrate 100x. Further, in the thickness direction, the auxiliary wiring 13 may be arranged on a top surface of the TFT layer 12 as illustrated in FIG. 4, for example. Alternatively, the auxiliary wiring 13 may be disposed in the TFT layer 12, and a pad may be disposed below the connecting electrodes 17 on the top surface of the TFT layer 12.

The auxiliary wiring 13 can be composed of, for example, a metal layer or an alloy layer containing aluminum (Al), as a material having a low sheet resistance. For example, aluminum (Al) alloy has a small electrical resistivity of $2.82 \times 10^{-8}$ (10 nΩm), and is also suitable as a material for the auxiliary wiring from the viewpoint of cost. The auxiliary wiring 13 may be made of the same material as the wiring in the TFT layer 12.

Planarizing Layer

The planarizing layer 16 is formed on the substrate 100x. The planarizing layer 16 is made of a resin material and is for planarizing unevenness in the top surface of the TFT layer 12. Examples of the resin material include positive photosensitive materials. Examples of photosensitive materials include acrylic resins, polyimide resins, and the like. Further, in the planarizing layer 16, the contact holes 16a (see FIG. 6B) are provided in one-to-one correspondence with the pixel electrodes 19 so as to penetrate through the planarizing layer 16, and connecting electrode recesses 14 are formed in the contact holes 16a below the pixel electrodes 19. Further, in the planarizing layer 16, the contact holes 16b (see FIG. 6B) are provided in one-to-one correspondence with the connecting electrode 17 so as to penetrate through the planarizing layer 16, and connecting electrode recesses 15 are formed in the contact holes 16b below the connecting electrode 17.

In plan view, the contact holes 16b may exist within the openings 22b of the widened portions 22a of the column banks 22Y, or outside inner walls of the openings 22b below the column banks 22Y, or across the inside and outside of the openings 22b. Further, in plan view, the contact holes 16b may exist below the row banks 22X.

Pixel Electrodes

As illustrated in FIG. 4, the pixel electrodes 19 are provided on the planarizing layer 16 of the substrate 100x in one-to-one correspondence with the sub-pixels. The pixel electrodes 19 each include a metal layer made of a light reflective material, and are formed on the planarizing layer 16. The pixel electrodes 19 in one-to-one correspondence with the sub-pixels are electrically connected to the TFT layer 12 via the connecting electrode recesses 14 formed inside contact holes. According to at least one embodiment, the pixel electrodes 19 function as anodes.

Specific examples of metal material having light reflectivity include silver (Ag), aluminum (Al), aluminum alloy, molybdenum (Mo), alloy of silver, palladium, and copper (APC), alloy of silver, rubidium, and gold (ARA), and the like. The pixel electrodes 19 may each be composed of a single metal layer, or may be a laminated structure in which a layer made of metal oxide such as indium tin oxide (ITO) or indium zinc oxide (IZO) is laminated on a metal layer.

Connecting Electrodes

The connecting electrodes 17 each include a metal layer made of a metal material, and are formed on the planarizing layer 16. The connecting electrodes 17 are relay means for electrically connecting the common electrode 25 and the auxiliary wiring 13. The hole injection layers 20 provided on the connecting electrodes 17 and the pixel electrodes 19, within the openings 22b of the column banks 22Y, are in contact with the common electrode 25 via the openings 24a provided in the electron injection transport layer 24, and are electrically connected to the auxiliary wiring 13 via the connecting electrode recesses 15 formed in the contact holes provided in the planarizing layer 16. The connecting electrodes 17 may be made of the same material as the pixel electrodes 19.

Hole Injection Layers

As illustrated in FIG. 4, the hole injection layers 20 (hereinafter also referred to simply as "layers") are laminated on the pixel electrodes 19. The hole injection layers 20 are provided on the pixel electrodes 19 for the purpose of promoting injection of holes from the pixel electrodes 19 to the light emitting layers 23.

Further, the hole injection layers 20 are also formed on the connecting electrodes 17 within the openings 22b of the column banks 22Y.

The hole injection layers 20 may be an oxide of a metal such as silver (Ag), molybdenum (Mo), chromium (Cr), vanadium (V), tungsten (W), nickel (Ni), or iridium (Ir), a low molecular weight organic compound, or a high molecular weight material such as polyethylene dioxythiophene polystyrene sulfonate (PEDOT: PSS).

Further, when the hole injection layers 20 are composed of a metal oxide or low molecular weight organic compound, electrical resistance is lower than that of the hole transport layers 21 and the electron injection transport layer 24, which are mainly composed of organic compounds, and film thickness is thinner than that of the electron injection transport layer 24, and therefore via the hole injection layers 20 provided on the connecting electrodes 17, the connecting electrode 17 and the common electrode 25 can be electrically connected with low electrical resistance and the auxiliary wiring 13 and the common electrode 25 can be electrically connected with each other.

Within the openings 22b of the column banks 22Y, portions of the hole injection layers 20 may be trimmed and openings (not shown) may be provided in the hole injection layers 20. Through such openings (not shown), the common electrode 25 and the auxiliary wiring 13 can be electrically connected.

Further, according to the present embodiment, in the openings 22b of the column banks 22Y, the hole injection layers 20 are formed on the connecting electrodes 17 but according to at least one embodiment, the hole injection layers 20 are not provided on the connecting electrodes 17.

Banks

As illustrated in FIG. 4, the column banks 22Y and the row banks 22X made of insulating material are formed so as to cover edges of the pixel electrodes 19 and the hole injection layers 20.

The column banks 22Y have line bank shapes extending in the Y direction between the sub-pixel columns CR, CG, CB arranged along the X direction, partitioning in the X direction the pixel electrodes 19 arranged in a one-to-one correspondence with sub-pixels above the substrate 100x. An electrically insulative material is used in the column banks 22Y. As specific examples of the electrically insulative material, an insulating organic material may be used (for example, acrylic resin, polyimide resin, novolac resin, phenol resin, or the like).

The column banks 22Y function as structures for preventing colors of ink from overflowing and mixing when the light emitting layers 23 are formed by an ink application method. When a resin material is used, from the viewpoint of processability, it is preferable that the resin material have photosensitivity. The column banks 22Y preferably have organic solvent resistance and heat resistance. Further, in order to suppress ink overflow, it is preferable that surfaces of the column banks 22Y have a defined liquid repellency.

Further, on the planarizing layer 16, above the auxiliary wiring 13, there are connection areas CA in which the pixel electrodes 19 do not exist, for electrically connecting the common electrode 25 and the auxiliary wiring 13, and in the connection areas CA, the connecting electrodes 17 are disposed as relay means for ensuring electrical connection between the auxiliary wiring 13 and the common electrode 25.

The row banks 22X are made of an electrically insulative material, cover ends of the pixel electrodes 19 in the Y direction in the sub-pixel columns (FIG. 2), and partition the pixel electrodes 19 from each other in the Y direction. The row banks 22X have roles in suppressing discontinuity of the light emitting layers 23 in each of the sub-pixel columns CR, CG, CB, and improving electrical insulation between the pixel electrodes 19 and the common electrode 25.

Film thickness of the row banks 22X is set to be smaller than a top surface of the light emitting layers 23 in an ink state, but larger than a top surface of the light emitting layers 23 after drying. As a result, each of the light emitting layers 23 in the sub-pixel columns CR, CG, CB is not partitioned by the row banks 22X, and flow of ink is not hindered within the sub-pixel columns CR, CG, CB when forming the light emitting layers 23. This facilitates making the thickness of the light emitting layers 23 in each sub-pixel column uniform. The row banks 22X may be made of an electrically insulating material having a lower liquid repellency than the column banks 22Y.

Hole Transport Layers

As illustrated in FIG. 4, the hole transport layers 21 are laminated on the hole injection layers 20 in the gaps 22zR, 22zG, 22zB. The hole transport layers 21 have a function of transporting holes injected from the hole injection layers 20 to the light emitting layers 23. Further, the hole transport layers 21 function as a base layer for the light emitting layers 23 described later, and have a structure including an organic compound. The hole transport layers 21 may be an organic compound derivative, a metal complex, or the like, a high molecular weight compound such as a polymer, a low molecular weight compound such as a monomer, and are formed by a wet process such as application of an ink solution in which a high molecular weight compound and/or low molecular weight compound is dissolved in a solvent.

The hole transport layers 21 selectively formed by an application method are not formed in the openings 22b of the column banks 22Y.

Light Emitting Layers

As illustrated in FIG. 4, the light emitting layers 23 are laminated on the hole transport layers 21. The light emitting layers 23(R), 23(G), 23(B) (also collectively referred to as "light emitting layers 23) are formed in the gaps 22z, and have functions of emitting R, G, B colors of light according to hole and electron recombination. The light emitting layers 23 each have a structure of an applied film formed by applying an ink containing an organic light emitting material and a defined solvent onto a base layer, then drying the ink. As an organic light emitting material used for the light emitting layers 23, for example, a fluorescent substance such as an organic compound, an organic compound derivative, an organic compound metal complex, a rare earth complex, or the like, or a phosphorescent substance such as a phosphorescent metal complex can be used.

Further, the light emitting layers 23 may be formed by using a high molecular weight compound such as a derivative or a mixture of a low molecular weight compound and a high molecular weight compound.

The light emitting layers 23 selectively formed by an application method are not formed in the openings 22b of the column banks 22Y, while the hole transport layers 21, the electron injection transport layer 24, and the common electrode 25 are laminated in this order on the upper surface of the connecting electrodes 17 in the openings 22b.

Electron Injection Transport Layer

As illustrated in FIG. 4, the electron injection transport layer 24 is laminated so as to cover the light emitting layers 23 in the gaps 22z and surfaces 22Yb of the column banks 22Y. The electron injection transport layer 24 is formed to be continuous over at least the entirety of the image display area 10a of the display panel 10. The electron injection transport layer 24 has a function of transporting electrons from the common electrode 25 to the light emitting layers 23.

An example of an organic material having high electron transportability used for the electron injection transport layer 24 is a π electron low molecular weight organic material such as an oxadiazole derivative (OXD), a triazole derivative (TAZ), a phenanthroline derivative (BCP, Bphen), or the like.

The electron injection transport layer 24 may be formed, for example, as a layer in which a metal selected from alkali metals or alkaline earth metals is a dopant in an organic material having a high electron transport property.

Portions of the electron injection transport layer 24 in the openings 22b of the column banks 22Y are trimmed to provide the openings 24a in the electron injection transport layer 24. An electrical connection between the common electrode 25 and the auxiliary wiring 13 is achieved through the openings 24a.

Common Electrode

As illustrated in FIG. 4, the common electrode 25 is formed on the electron injection transport layer 24. The common electrode 25 is an electrode common to all the light emitting layers 23, and is continuous over at least the entirety of the image display area 10a of the display panel 10. The common electrode 25 is made of a light transmissive electrically conductive material, and is formed on the electron injection transport layer 24. The common electrode 25 functions as a cathode.

The common electrode 25 is paired with the pixel electrodes 19 to sandwich the light emitting layers 23 to form current paths and supply carriers to the light emitting layers 23. For example, when functioning as a cathode, electrons are supplied to the light emitting layers 23.

A metal layer, a metal oxide layer, or a laminate of a metal layer and a metal oxide layer may be used for the common electrode 25. As the metal layer, for example, a metal thin film can be used.

In order to more effectively obtain an optical resonator structure, as a material of the common electrode 25, a metal thin film is preferably formed from at least one material selected from aluminum, magnesium, silver, aluminum lithium alloy, magnesium silver alloy, and the like. In this case, film thickness of the metal thin film is preferably from 20 nm to 50 nm. As a result, the common electrode 25 is light transmissive, and optical resonator structures can be constructed between reflective surfaces of the pixel electrodes 19 and the common electrode 25, so that luminance efficiency can be further improved.

Further, as the metal oxide layer, for example, a light transmissive electrically conductive film such as indium tin oxide (ITO) or indium zinc oxide (IZO) may be used.

In order to secure optical path length of an optical resonator structure, a light transmissive electrically conductive film of ITO, IZO, or the like may be formed between the electron injection transport layer 24 and the common electrode 25 having a desired film thickness to adjust the optical distance between the light emitting layer 23 and the common electrode 25 to an appropriate size.

The common electrode 25 is in contact with the connecting electrodes 17 or the hole injection layers 20 on the connecting electrodes 17 through the openings 24a provided in the electron injection transport layer 24 in the openings 22b of the column banks 22Y, and the connecting electrodes 17 are connected to the auxiliary wiring 13 due to the connecting electrode recesses 15. This achieves an electrical connection between the common electrode 25 and the auxiliary wiring 13.

Sealing Layer

The sealing layer 26 is laminated so as to cover the common electrode 25. The sealing layer 26 is provided to prevent organic layers such as the hole transport layers 21, the light emitting layers 23, the electron injection transport layer 24, and the like from being deteriorated due to exposure to external moisture or air.

The sealing layer 26 is formed using, for example, a light-transmissive material such as silicon nitride (SiN), silicon oxynitride (SiON), or the like.

Bonding Layer

A color filter substrate 31 including color filter layers 32 on a main surface on a lower side in the Z axis direction of an upper substrate 30 is disposed above the sealing layer 26 in the Z axis direction, and is bonded by a bonding layer 27. The bonding layer 27 has functions of bonding the color filter substrate 31 to a back panel composed of layers from the substrate 100x to the sealing layer 26 and preventing layers from being exposed to moisture or air. Material of the bonding layer 27 is, for example, a light transmissive resin adhesive or the like.

Upper Substrate

The color filter substrate 31 including the color filter layers 32 formed on the upper substrate 30 is mounted and bonded on the bonding layer 27. The display panel 10 is a top emission type of panel, and therefore a light transmissive material such as a cover glass made of a glass substrate or quartz substrate, a plastic substrate, a light transmissive resin film, or the like is used as the upper substrate 30. The upper substrate 30 can improve rigidity and protect the hole transport layers 21, the light emitting layers 23, the electron injection transport layer 24, and the like from intrusion of external moisture, air, and the like. An antiglare polarizing plate may be attached to the upper substrate 30.

Color Filter Layers

The color filter layers 32 are formed on the upper substrate 30 at positions corresponding to colors of the self-luminous areas 100a of pixels. The color filter layers 32 are light transmissive layers provided to transmit visible light having wavelengths corresponding to R, G, B colors, and in transmission of light emitted from each color of pixel, they each have a function of correcting chromaticity of emitted light. For example, red, green, and blue color filter layers 32R, 32G, 32B are formed above the gaps 22zR, 22zG, 22zB, respectively. As the color filter layers 32, known resin materials can be adopted.

Light Shielding Layer 33

On the upper substrate 30, a light shielding layer 33 is formed at positions corresponding to boundaries between the light emitting areas 100a of each sub-pixel. The light shielding layer 33 is a black resin layer provided to prevent visible light having wavelengths corresponding to R, G, B from being transmitted, and is made of, for example, a resin material containing a black pigment having excellent light absorption and light shielding properties. The light shielding layer 33 is made of a resin material containing an ultraviolet light curable resin material as a main component and a black pigment made of a light shielding material such as a carbon black pigment, a titanium black pigment, a metal oxide pigment, or an organic pigment.

Method of Manufacturing Display Panel 10

Figure 5:
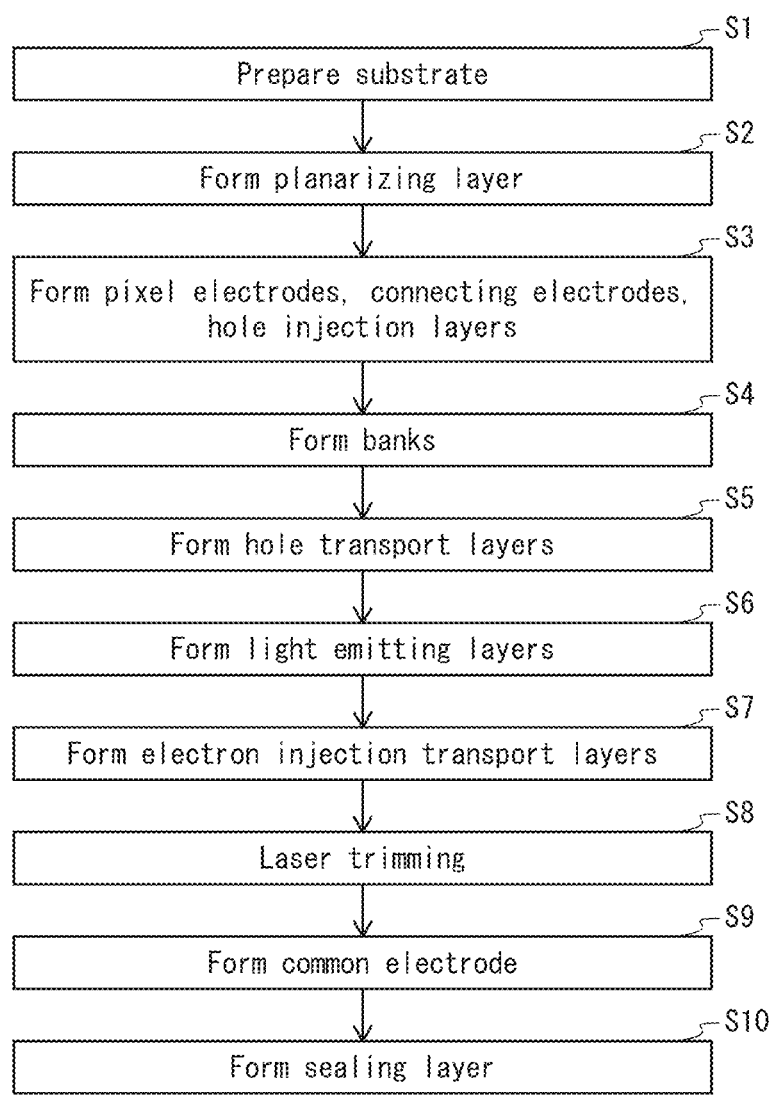
FIG. 5 is a flowchart of a process of manufacturing display 10.

A method of manufacturing the display panel 10 is described with reference to drawings from FIG. 5 to FIG. 10G. FIG. 5 is a flowchart of a process of manufacturing the display panel 10 according to at least one embodiment. Each drawing from FIGS. 6A to 10G is a schematic cross section diagram taken along the same position as the line B-B in FIG. 2, illustrating a state in manufacture of the display panel 10.

Forming Back Panel

Prepare the substrate 100x with TFTs and wiring formed thereon. The substrate 100x can be manufactured by a known TFT manufacturing method (step S1 in FIG. 5, FIG. 6A). TFT elements, for example, the pads 12s on source electrodes, and the auxiliary wiring 13 are arranged on an upper surface of the substrate 100x, the auxiliary wiring 13 extending across the upper surface.

Figure 6A:
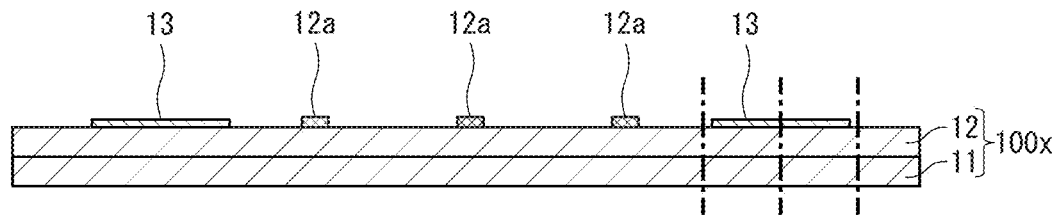
FIGS. 6A, 6B, 6C and 6D are schematic diagrams of cross sections taken along the same position as the line A-A in FIG. 1, illustrating states of display panel 10 during manufacturing.
Figure 6B:
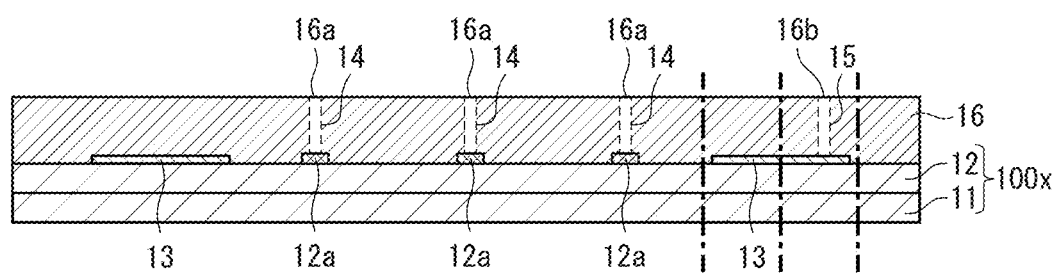

Constituent material (photosensitive resin material) of the planarizing layer 16 described above is applied as a photoresist to cover the substrate 100x, and the planarizing layer 16 is formed by planarizing the surface (step S2 in FIG. 5, FIG. 6B).

A dry etching method is performed on the planarizing layer 16 at locations of the pads 12a and the auxiliary wiring 13 to form the contact holes 16a, 16b, and subsequently, the connecting electrode recesses 14, 15 are formed along inner walls of the contact holes. The connecting electrode recesses 14, 15 may be formed, for example, by forming a metal film by a sputtering method then patterning by a photolithography method and a wet etching method.

Next, the pixel electrodes 19, the connecting electrodes 17, and the hole injection layers 20 are formed (step S3 in FIG. 5). The pixel electrodes 19 are formed such that portions of some of the pixel electrodes 19 are above the auxiliary wiring 13, and the connection areas CA remain above the auxiliary wiring 13 where the pixel electrodes 19 are not present, and the connecting electrodes 17 are formed in the connection areas CA. In forming the pixel electrodes 19, in plan view, outer edge portions of the pixel electrodes 19 facing outer edges of the connection areas CA are recessed inwards of the pixel electrodes 19.

Figure 6C:
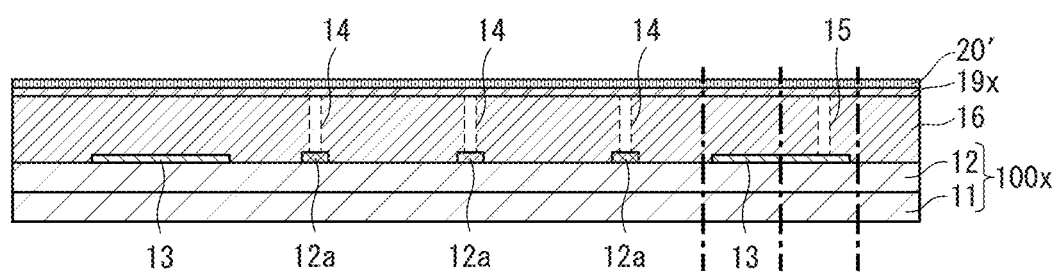

In this process, first, a metal film 19x for forming the pixel electrodes 19 and the connecting electrodes 17 is formed by laminating a metal film by a vapor phase growth method such as a sputtering method or a vacuum vapor deposition or the like, then patterned by using a photolithography method and an etching method (FIG. 6C).

More specifically, after pre-film-forming cleaning of a surface of the planarizing layer 16, the metal film 19x for forming the pixel electrodes 19 and the connecting electrodes 17 is formed on the surface of the planarizing layer 19 by a vapor phase growth method (FIG. 6C). According to at least one embodiment, a film made of aluminum or an alloy containing aluminum as a main component is formed by a sputtering method.

Further, after pre-film-forming cleaning of a surface of the metal film 19x, a metal layer 20A' for forming the hole injection layers 20 is formed on the surface of the metal film 19x by a vapor phase growth method (FIG. 6C). According to at least one embodiment, a film of tungsten is formed by a sputtering method.

Figure 6D:
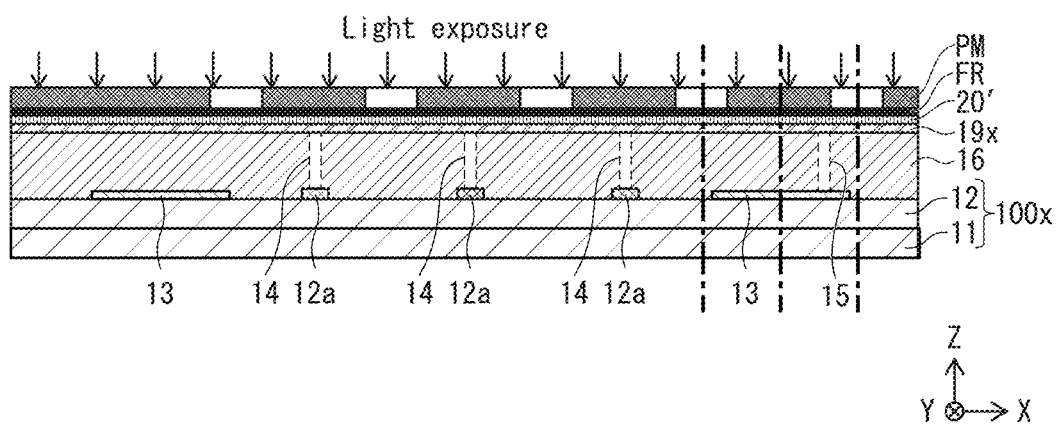

Subsequently, after applying a photoresist layer FR made of a photosensitive resin or the like, a photomask PM having a defined opening is placed, and irradiated with light from above to expose the photoresist and transfer the pattern of the photomask to the photoresist (FIG. 6D). Next, the photoresist layer FR is patterned by developing.

Subsequently, the metal layer 20A' is subjected to a dry etching process through the patterned photoresist layer FR to perform patterning and form the hole injection layers 20.

Next, the metal film 19x is subjected to a wet etching process through the patterned photoresist layer FR and the hole injection layers 20 to perform patterning, thereby forming the pixel electrodes 19 and the connecting electrodes 17.

Figure 7A:
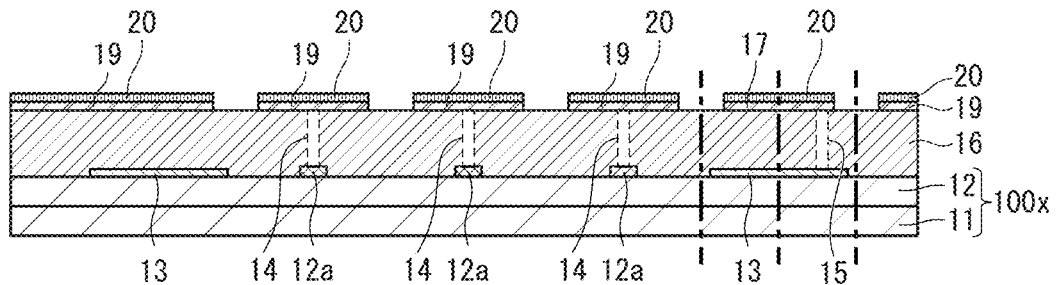
FIGS. 7A, 7B and 7C are schematic diagrams of cross sections taken along the same position as the line A-A in FIG. 1, illustrating states of display panel 10 during manufacturing.
Figure 7B:
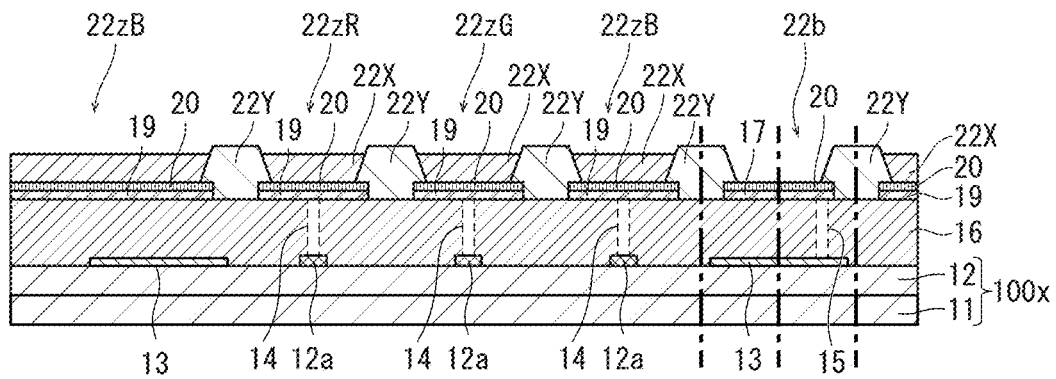

The photoresist layer FR is then peeled off to result in laminated layers of the pixel electrodes 19 and the hole injection layers 20 patterned to have the same shapes and laminated layers of the connecting electrodes 17 and the hole injection layers 20 patterned to have the same shapes (FIG. 7A).

After forming the hole injection layers 20, the banks 22 are formed so as to cover the hole injection layers 20. In forming the banks 22, the row banks 22X are formed first, then the column banks 22Y are formed so as to form the gaps 22z and the openings 22b (step S4 in FIG. 5, FIG. 7B).

To form the row banks 22X, first, a film made of a constituent material (for example, a photosensitive resin material) of the row banks 22X is laminated and formed on the hole injection layers 20 by using a spin coating method or the like. Next, the resin film is patterned to form the row banks 22X.

Patterning of the row banks 22X is performed by exposure using a photomask above the resin film, developing, and baking (approximately 230° C. for approximately 60 minutes).

Next, in forming the column banks 22Y, a film made of a constituent material (for example, a photosensitive resin material) of the column banks 22Y is laminated onto the hole injection layers 20 and the row banks 22X by using a spin coating method or the like. Then, to form the gaps 22z and the openings 22b, a mask is placed above the resin film and exposed to light, and subsequent developing patterns the resin film to open up the gaps 22z and the openings 22b and form the column banks 22Y.

More specifically, in forming the column banks 22Y, first, a photosensitive resin film made of an organic photosensitive resin material is formed and dried, volatilizing solvent to some extent, then a photomask with defined openings is overlaid and irradiated from above with ultraviolet rays to expose a photoresist made of the photosensitive resin, transferring a pattern of the photomask to the photoresist.

Next, the photosensitive resin is developed to form patterned insulating layers then baked (at approximately 230° C. for approximately 60 minutes) to form the column banks 22Y.

In forming the column banks 22Y, the column banks 22Y are formed to have widened portions 22a that include openings located above the connection areas CA of the substrate 100x in plan view.

Figure 7C:
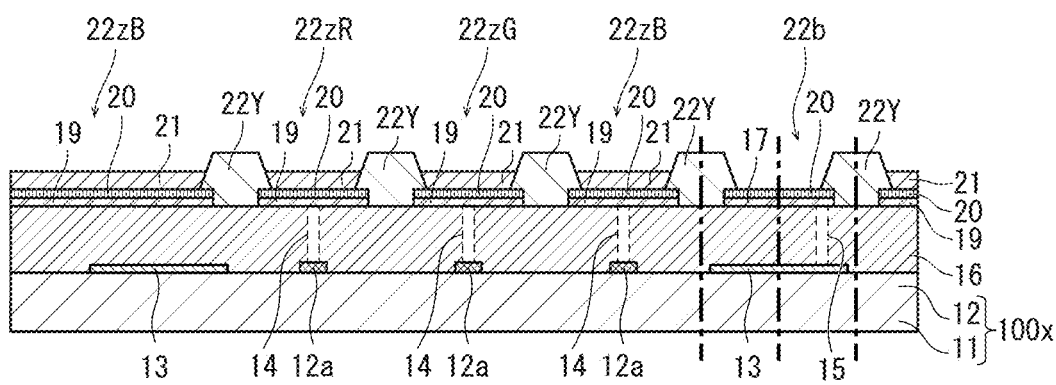
Figure 8A:
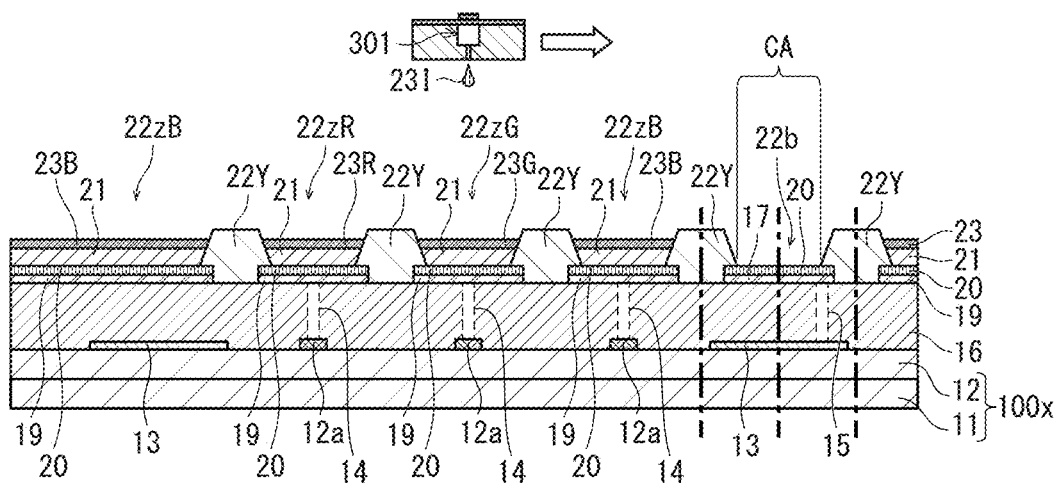
FIGS. 8A, 8B and 8C are schematic diagrams of cross sections taken along the same position as the line A-A in FIG. 1, illustrating states of display panel 10 during manufacturing.

Next, the hole transport layers 21 and the light emitting layers 23 are formed in this order on the hole injection layers 20 in the gaps 22z defined by the column banks 22Y, including above the row banks 22X (steps S5, S6 in FIG. 5, FIG. 7C, 8A).

The hole transport layers 21 are formed by using a wet process such as an inkjet method or gravure printing method to apply ink containing constituent material into the gaps 22z defined by the column banks 22Y, then volatilized or baked to remove solvent (FIG. 7C). The hole transport layers 21 are not formed in the openings 22b.

The light emitting layers 23 are formed by applying inks containing constituent materials in the gaps 22z defined by the column banks 22Y using an inkjet method, then baking (FIG. 8A). More specifically, the substrate 100x is placed on an operation table of a droplet ejection device so that the column banks 22Y are aligned in the Y direction, and a plurality of nozzle holes of an inkjet head 301 are arranged in a line along the Y direction. While the inkjet head 301 and the substrate 100x move relative to each other in the X direction, ink droplets 231 are ejected from each nozzle hole aiming at landing targets in the gaps 22z between the column banks 22Y. Here also, the light emitting layers 23 are not formed in the openings 22b.

Further, in this process, the gaps 22z, which are sub-pixel formation areas, are each filled with the inks 231 containing material of R, G, or B organic light emitting layers by an inkjet method, and applied ink is dried in a low pressure environment and baked to form the light emitting layers 23R, 23G, 23B. At this time, in applying the inks 231 of the light emitting layers 23, first, solutions for forming the light emitting layers 23 are applied using a droplet ejection device.

Methods for forming the hole transport layers 21 and the light emitting layers 23 are not limited to the above, and ink may be applied by known methods other than inkjet methods and gravure printing methods, such a dispenser method, a nozzle coating method, a spin coating method, intaglio printing, letterpress printing, and the like.

Figure 8B:
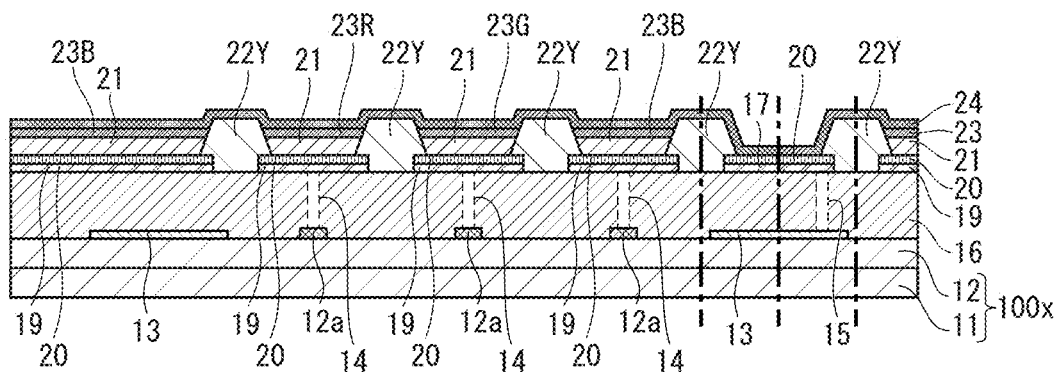
Figure 8C:
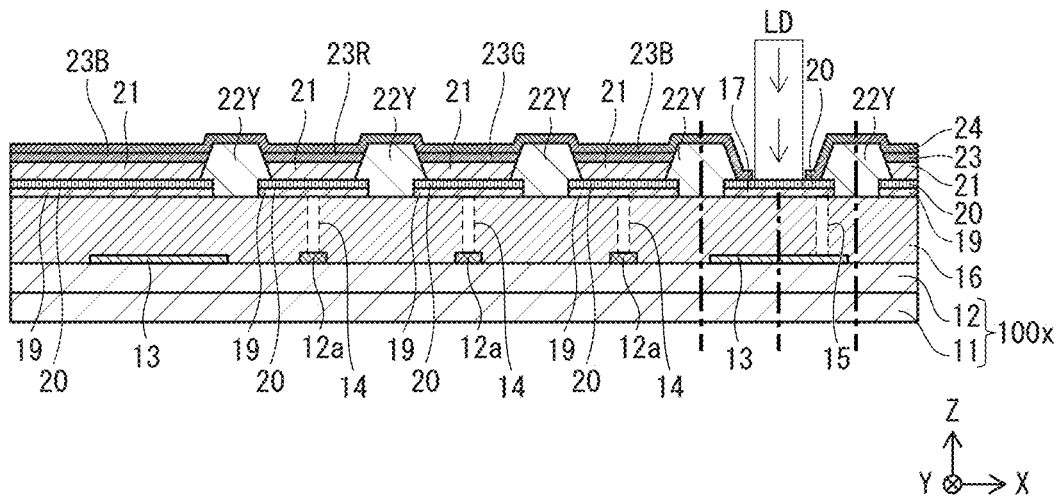

After forming the light emitting layers 23, the electron injection transport layer 24 is formed over an entire light emission area (display area) of the display panel 10 by a vacuum vapor deposition method or the like (step S7 in FIG. 5, FIG. 8B). A reason for using a vacuum vapor deposition method is that it does not damage the light emitting layers 23, which are organic films, and in a vacuum vapor deposition method performed in high vacuum, molecules are deposited vertically directly towards the substrate to form a film. The electron injection transport layer 24 is formed on the light emitting layers 23 by co-deposition of an organic material and a metal material, to form a film having a thickness from 20 nm to 50 nm, for example. Film thickness of the electron injection transport layer 24 is an example, and is not limited to the above values, and is an appropriate film thickness that is most advantageous for optical light extraction.

Figure 9A:
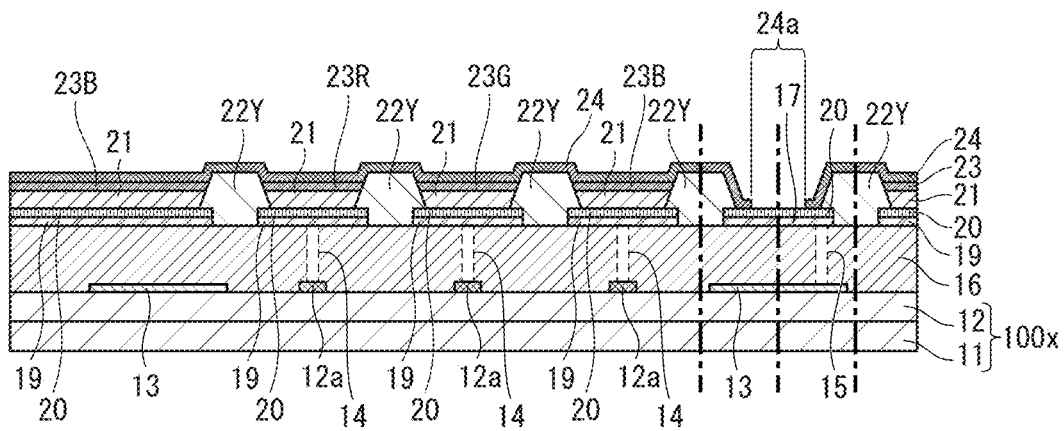
FIGS. 9A, 9B and 9C are schematic diagrams of cross sections taken along the same position as the line A-A in FIG. 1, illustrating states of display panel 10 during manufacturing.

Next, portions of the electron injection transport layer 24 in the openings 22b are irradiated with a laser light LD to remove portions of the electron injection transport layer 24 in the openings 22b in the widened portions 22a of the column banks 22Y. Laser processing removes target material by raising temperature of a portion irradiated and changing that portion from a solid phase to a liquid phase or further to a gas phase. As a result, portions of the electron injection transport layer 24 are trimmed to open up the openings 24a at least in the openings 22b, exposing portions of the connecting electrodes 17 through the openings 24a (FIG. 9A).

More specifically, a laser processing device includes a laser head (not illustrated) that executes trimming by irradiating a thin film on a substrate with laser light, based on a program stored in advance in internal storage memory or the like, at a laser output and scanning speed that can selectively remove only a thin film processing target.

Here, a known solid-state laser processing machine or the like can be used as the laser processing device. For laser light, for example, a yttrium aluminum garnet (YAG) laser, a UV laser, or the like can be used as semiconductor laser selected from a wavelength range from 200 nm to 380 nm.

Further, irradiation with laser light of the electron injection transport layer 24 is preferably performed in a vacuum environment where a vacuum pump is used to reduce pressure of a chamber into which the substrate is inserted, in order to suppress deterioration of properties of various organic materials constituting light emitting elements caused by influence of oxygen and moisture in the atmosphere.

Further, the connecting electrodes 17 become base layers during laser trimming of the electron injection transport layer 24, and therefore it is preferable that the connecting electrodes 17 are not damaged by the laser irradiation. By selecting a material of the connecting electrodes 17 to have a lower light absorption rate than the electron injection transport layer 24 for the wavelength of irradiating laser light, the connecting electrodes 17 are made to have a high work resistance to the laser irradiation, and it is possible to prevent the connecting electrodes 17, which are base layers during laser trimming of the electron injection transport layer 24, from being damaged by the laser irradiation.

Further, the hole injection layers 20 are provided above the connecting electrodes 17, and the hole injection layers 20 are made of a material having a relatively low light absorption rate with respect to a wavelength of irradiating laser light.

Figure 9B:
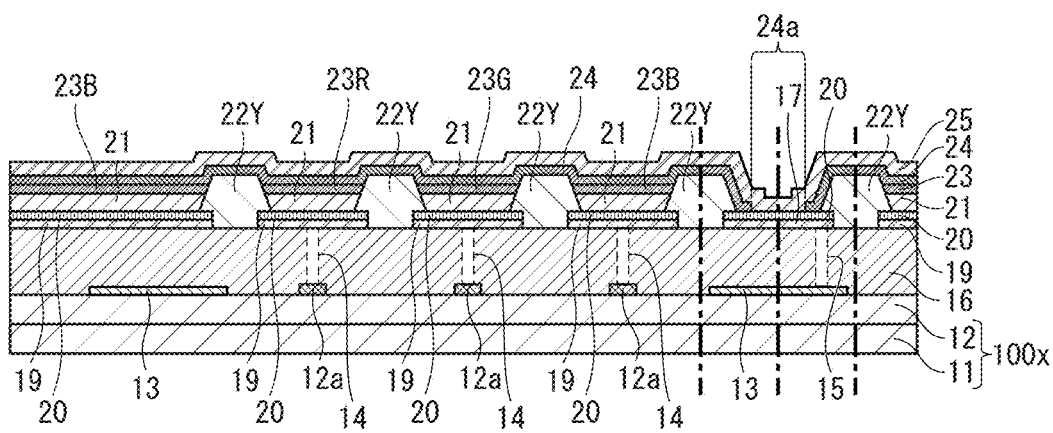

After forming the electron injection transport layer 24, the common electrode 25 is formed so as to cover the electron injection transport layer 24 (step S9 in FIG. 5, FIG. 9B). The common electrode 25 may include a layer containing a metal as a main component and a layer made of a metal oxide.

Of these, first, the common electrode 25 is formed by a chemical vapor deposition (CVD) method, a sputtering method, or a vacuum deposition method so as to cover the electron injection transport layer 24 (FIG. 9B). For example, the common electrode 25 is formed by depositing silver by a vacuum vapor deposition method. Alternatively, the common electrode 25 may be a light transmissive electrically conductive layer of ITO, IZO, or the like applied by a sputtering method.

By forming the common electrode 25, portions of the connecting electrodes 17 connected to the auxiliary wiring 13 can reliably be in contact with the common electrode 25 via the openings 24a trimmed away from the electron injection transport layer 24 that extends in the column direction in the openings 22b of the widened portions 22a of the column banks 22Y, ensuring electrical connection between the auxiliary wiring 13 and the common electrode 25.

Figure 9C:
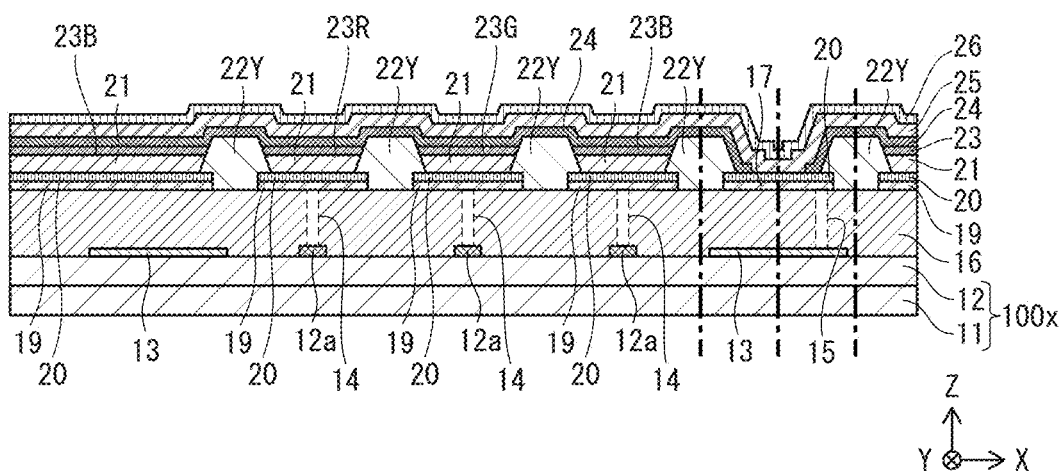

The sealing layer 26 is formed so as to cover the common electrode 25 (step S10 in FIG. 5, FIG. 9C). The sealing layer 26 can be formed using a CVD method, a sputtering method, or the like.

Forming Color Filter Substrate 31

The following describes a process of manufacturing the color filter substrate 31.

Figure 10A:
FIGS. 10A, 10B, 10C, 10D, 10E, 10F and 10G are schematic diagrams of cross sections taken along the same position as the line A-A in FIG. 1, illustrating states of display panel 10 during manufacturing.

The upper substrate 30 that is light transmissive is prepared, and a light shielding layer material made of an ultraviolet curable resin (for example, an ultraviolet curable acrylic resin) as a main component with a black pigment added thereto is applied to a surface of the upper substrate 30 (FIG. 10A).

Figure 10B:
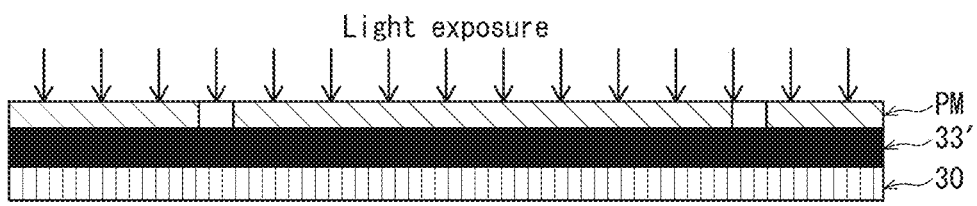

A pattern mask PM having defined openings is placed on an upper surface of the applied light shielding material film 33', and irradiated with ultraviolet rays from above (FIG. 10B).

Figure 10C:
Figure 10D:
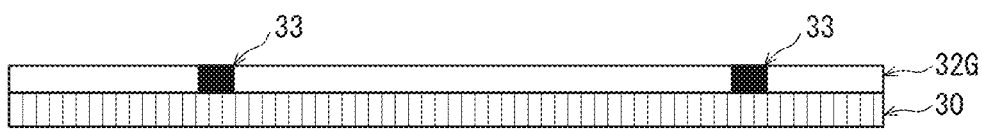

Subsequently, the pattern mask PM and uncured portions of the light shielding layer 33 are removed and developed, curing completing the light shielding layer 33, for example having an approximately rectangular shape in cross section (FIG. 10C).

Figure 10E:
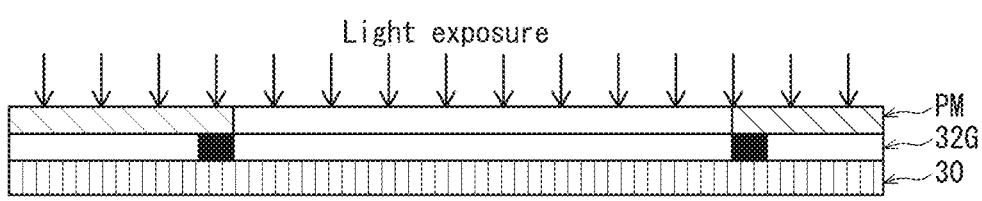

Next, for example, material 32G of the color filter layers 32 containing an ultraviolet curable resin component as a main component is applied to the surface of the upper substrate 30 on which the light shielding layer 33 is formed (FIG. 10D), a defined pattern mask PM is placed and irradiated with ultraviolet rays (FIG. 10E).

Figure 10F:
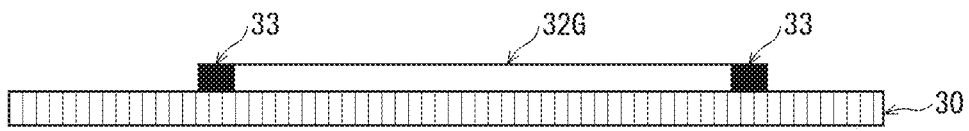

Subsequently, curing is performed, the pattern mask PM and uncured paste 32G are removed and developed, forming the color filter layers 32G (FIG. 10F).

Figure 10G:
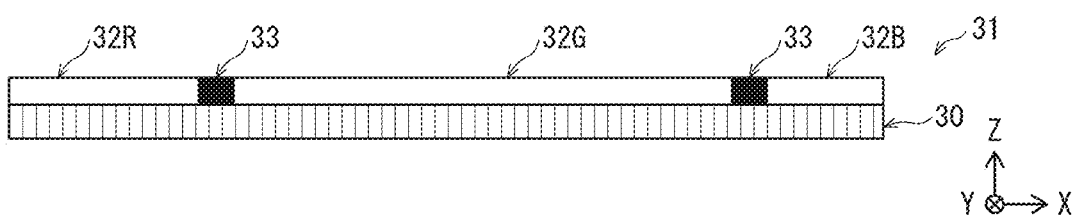

By repeating this process in the same way for color filter materials of each color, the color filter layers 32R, and 32B are formed (FIG. 10G). This completes the color filter substrate 31.

Bonding of Color Filter Substrate 31 and Back Panel

Figure 11A:
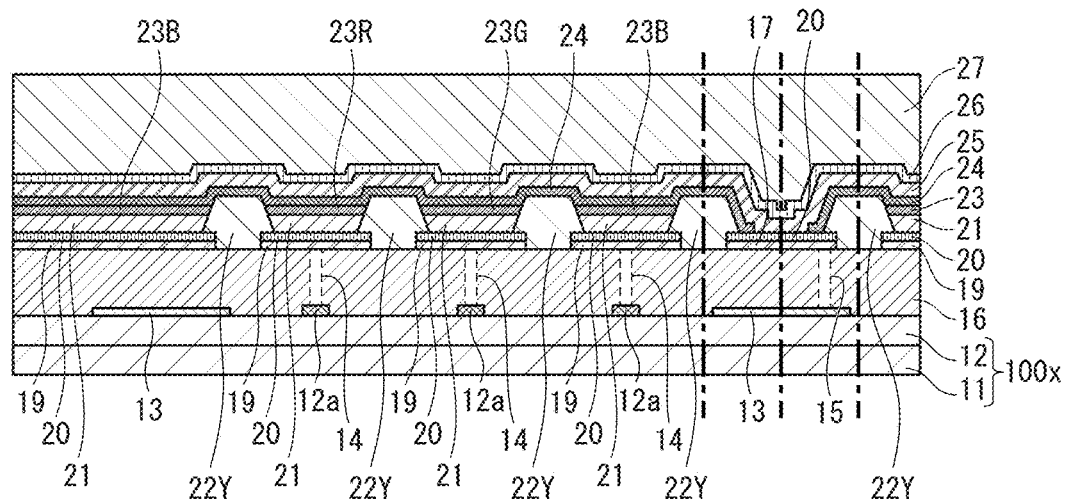
FIGS. 11A and 11B are schematic diagrams of cross sections taken along the same position as the line A-A in FIG. 1, illustrating states of display panel 10 during manufacturing.

Next, material of the bonding layer 27 whose main component is an ultraviolet curable resin such as an acrylic resin, silicone resin, or epoxy resin is applied to the back panel composed of layers from the substrate 100x to the sealing layer 26 (FIG. 11A).

Figure 11B:
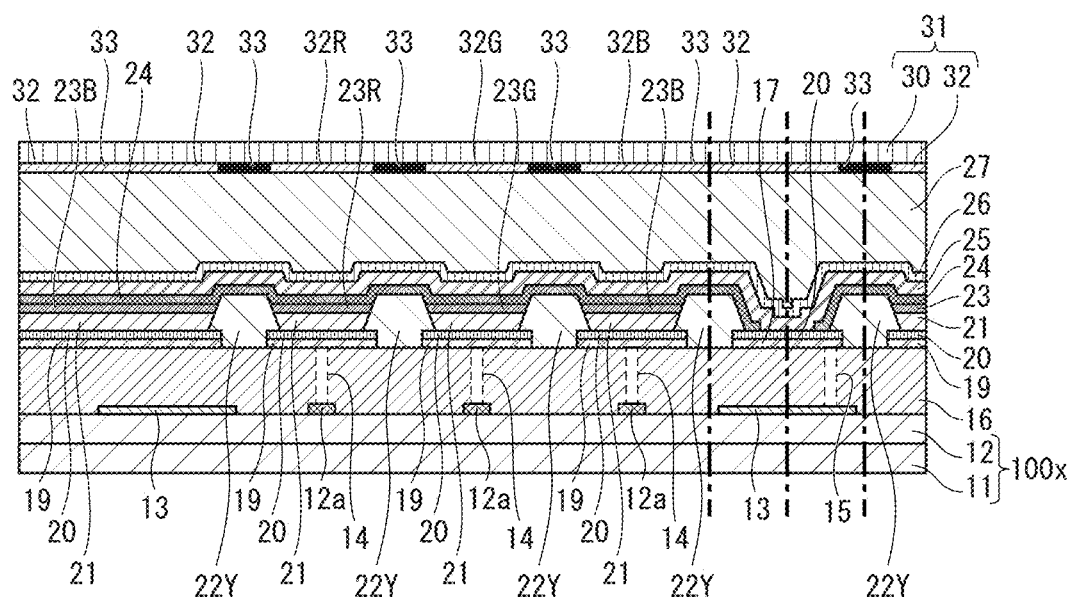

Subsequently, the applied material is irradiated with ultraviolet rays, and the back panel and the color filter substrate 31 are bonded together in a state where relative positions of both substrates are matched. At this time, care is taken to ensure gas does not enter between the two substrates. Subsequently, when both substrates are baked and a sealing process is completed, the display panel 10 is completed (FIG. 11B).

Effects (1) Effect of Suppressing Decrease in Aperture Ratio of Display Panel Due to Provision of Auxiliary Wiring As described above, the display panel 10 pertaining to at least one embodiment includes the substrate 100x, the auxiliary wiring 13 disposed on the substrate 100x, the pixel electrodes 19 disposed in a matrix of rows and columns above the substrate 100x with defined gaps between the pixel electrodes 19, the light emitting layers 23 disposed above the pixel electrodes 19, the functional layer 24 disposed above the light emitting layers 23, the functional layer 24 being continuous across the light emitting layers 23, and the common electrode 25 disposed above the functional layer 24, the common electrode 25 being continuous across the functional layer 24. The auxiliary wiring 13 extends in plane directions of a main surface of the substrate 100x below the pixel electrodes 19. Above the substrate 100x, the connection areas CA exist where the pixel electrodes 19 are not present, in which the common electrode 25 and the auxiliary wiring 13 are electrically connected to each other. In plan view, portions of outer edges of the pixel electrodes 19 facing outer edges of the connection areas CA are recessed inwards of the pixel electrodes 19.

Further, according to at least one embodiment, portions of the functional layer 24 above the connection areas CA are removed to create the openings 24a, and the common electrode 25 is in contact with the auxiliary wiring 13 or the connecting electrodes 17 or the hole insertion layer 20 electrically connected to the auxiliary wiring 13 exposed by the openings 24a in the functional layer 24.

As described above, in the display panel 10, the auxiliary wiring 13 is configured to extend in plane directions of the main surface of the substrate 100x below the pixel electrodes 19 and therefore even if area of the auxiliary wiring 13 is increased, a decrease in area of the self-luminous area 100a in the image display area 10a can be suppressed, unlike in a conventional display panel where an increase in area of the auxiliary wiring 13 is connected to a decrease in area of the self-luminous area 100a.

Further, in plan view, the outer edge portions of the pixel electrodes 19 facing the outer edges of the connection areas CA are recessed inwards of the pixel electrodes 19. That is, the pixel electrodes 19 around the connection areas CA are formed to avoid the connection areas CA by being recessed inwards so as to be separated from the connection areas CA by a defined distance in plan view. As a result, dark areas that do not emit light caused by the connection areas CA are dispersed and arranged at boundaries between the self-luminous areas 100a so that they are less noticeable. When connection areas CA are linearly arranged in rows or columns as in a conventional display panel, connection areas CA can be recognized as continuous linear dark areas that do not emit light. In contrast, according to at least one embodiment, a ratio of area of the self-luminous area 100a that is reduced by the connection areas CA is reduced, and dark areas that do not emit light due to the connection areas CA are dispersed to be scattered between the self-luminous areas 100a, and therefore a degree of reduction in display area visible to a viewer is also reduced.

According to this structure, the display panel 10 suppresses a decrease in aperture ratio, which is a ratio of the self-luminous area 100a to area of the display panel 10, caused by the provision of the auxiliary wiring 13, while also reducing resistance of current supply paths to light emitting elements, and therefore it is possible to implement an organic EL display panel that ameliorates in-plane luminance variation due to voltage drop.

Further, a method of manufacturing the display panel 10 according to at least one embodiment is manufacturing method including preparing the substrate 100x with the auxiliary wiring 13 extending in plane directions of a main surface of the substrate 100x, forming the pixel electrodes 19 arranged in a matrix of rows and columns above the substrate 100x with defined gaps between the pixel electrodes 19, a portion of the pixel electrodes 19 being disposed above the auxiliary wiring 13 and leaving the connection areas CA above the auxiliary wiring 13 where the pixel electrodes 19 are not present, forming the light emitting layers 23 above the pixel electrodes 19, forming the functional layer 24 above the light emitting layers 23 to be continuous across the light emitting layers 23, removing portions of the functional layer 24 above the connection areas CA to expose portions of the auxiliary wiring 13 or the connecting electrodes 17 or the hole injection layer 20 electrically connected to the auxiliary wiring 13, and forming the common electrode 25 above the functional layer 24, to be continuous across the functional layer 24, so that portions of the common electrode 25 and the auxiliary wiring 13, or the connecting electrodes 17 or the hole injection layer 20, are in contact with each other. In the forming of the pixel electrodes 19, in plan view, portions of outer edges of the pixel electrodes 19 facing outer edges of the connection areas CA are recessed inwards of the pixel electrodes.

According to this method, portions of the functional layer 24 are removed and the common electrode 25 is made to be in contact with the auxiliary wiring 13 or the connecting electrodes 17 or the hole injection layer 20 electrically connected to the auxiliary wiring 13 so that the common electrode 25 and the auxiliary wiring 13 can be electrically connected, making it possible to realize a method of manufacturing an organic EL display panel that suppresses a decrease in aperture ratio caused by the auxiliary wiring 13 as well as reducing resistance of power supply paths to light emitting elements.

(2) Effect of Connecting Electrodes 17 Provided in Connection Areas CA Being Surrounded by Widened Portions 22a of Column Banks 22Y According to the method of manufacturing the display panel 10, in forming the light emitting layers 23, the light emitting layers 23 are selectively formed only on the pixel electrodes 19 by using a printing method, and the light emitting layers 23 are not formed above the connecting electrodes 17.

According to the method of manufacturing the display panel 10, the light emitting layers 23R, 23G, 23B are selectively formed only in the gaps 22zR, 22zG, 22zB corresponding to respective sub-pixels by a printing method.

Further, the connecting electrodes 17 provided in the connection areas CA in the gaps 22zB are surrounded by the widened portions 22a of the column banks 22Y, and therefore the ink 231 of the light emitting layers 23 applied in the gaps 22zB does not flow into the openings 22b of the widened portions 22a, and the light emitting layers 23 are not formed above the connecting electrodes 17.

Aside from the light emitting layers 23, the hole transport layers 21, which are functional layers, are also selectively formed only in the gaps 22zR, 22zG, 22zB and not above the connecting electrodes 17 in the openings 22b of the widened portions 22a.

Accordingly, when adopting a structure in which the light emitting layers 23 are not formed in the openings 22b in which the connecting electrodes 17 are present, no special manufacturing equipment or process such as masking is required. Therefore, according to the method of manufacturing the display panel 10, a structure can be realized in which the hole transport layers 21 and the light emitting layers 23 are not formed above the connecting electrodes 17 without requiring special manufacturing costs or the like.

As a result, according to the method of manufacturing the display panel 10, film thickness of organic functional layers to be removed in laser trimming can be reduced, and therefore an amount of debris generated by laser irradiation can be reduced, and defects in sealing in subsequent processes due to debris can be prevented.

The self-luminous display panel according to an aspect of the present disclosure suppresses a decrease in aperture ratio, which is a ratio of self-luminous area to area of the display panel, caused by the provision of the auxiliary wiring, while also reducing resistance of current supply paths to light emitting elements, and therefore it is possible to provide an organic EL display panel and a method of manufacturing same that ameliorate in-plane luminance variation due to voltage drop.

Circuit Structure of Display Device 1

Figure 12:
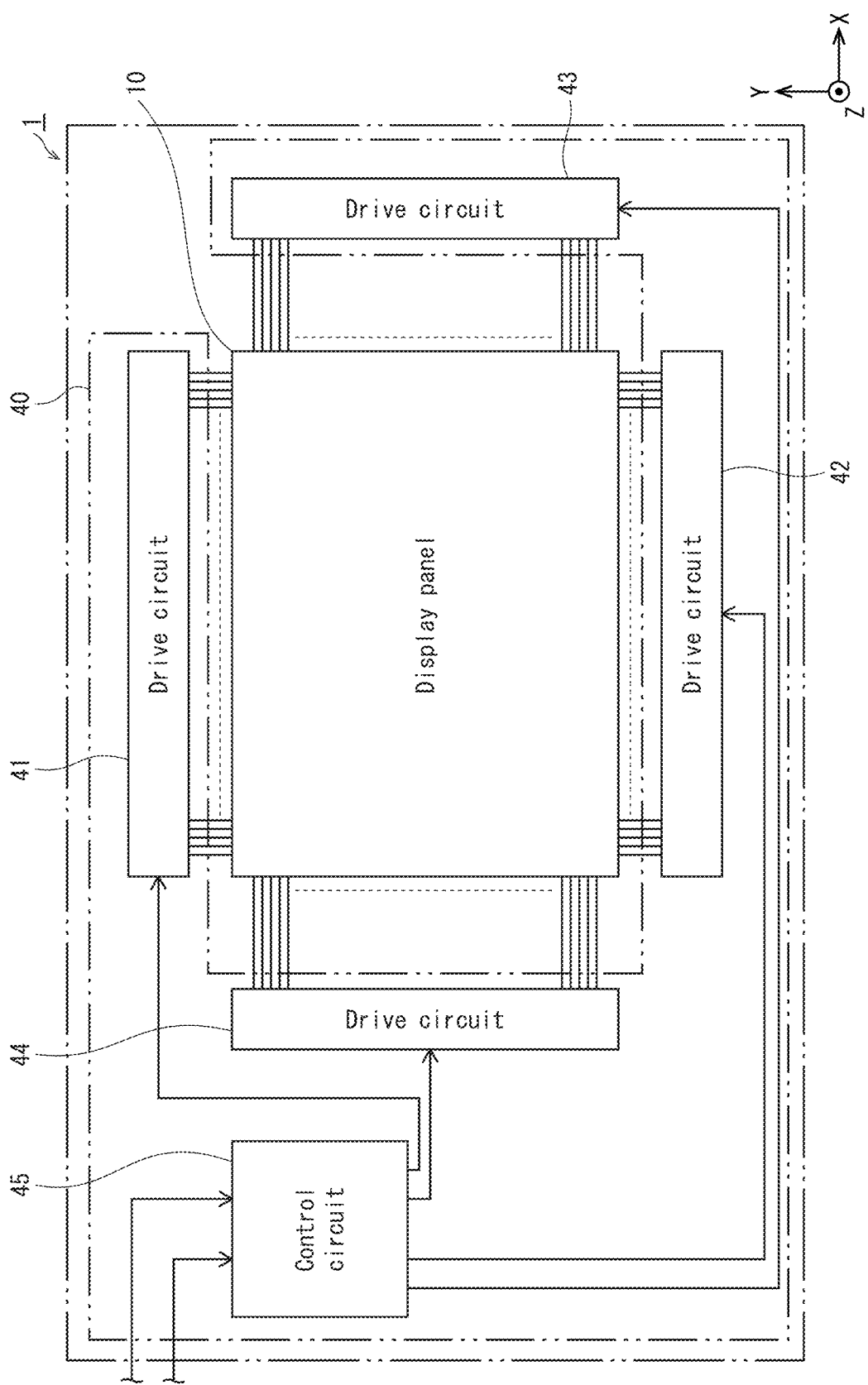
FIG. 12 is a schematic block diagram illustrating a circuit structure of organic EL display device 1 according to at least one embodiment.

The following describes circuit structure of the organic EL display device 1 (also referred to as "display device 1") pertaining to Embodiment 1, with reference to FIG. 12.

As illustrated in FIG. 12, the display device 1 includes the display panel 10 and drive control circuitry 40 connected to the display panel 10.

The display panel 10 is an organic EL panel that utilizes electroluminescence of organic materials, and is configured such that organic EL elements are arranged in a matrix, for example. The drive control circuitry 40 is composed of four drive circuits 41, 42, 43, 44 and a control circuit 45.

Circuit Structure of Display Panel 10

In the display panel 10, unit pixels 100e are arranged in a matrix of rows and columns to form a display area. Each of the unit pixels 100e is composed of three organic EL elements, that is, three sub-pixels 100se that emit red (R), green (G), and blue (B) light, respectively. The circuit structure of each sub-pixel 100se is described with reference to FIG. 13.

Figure 13:
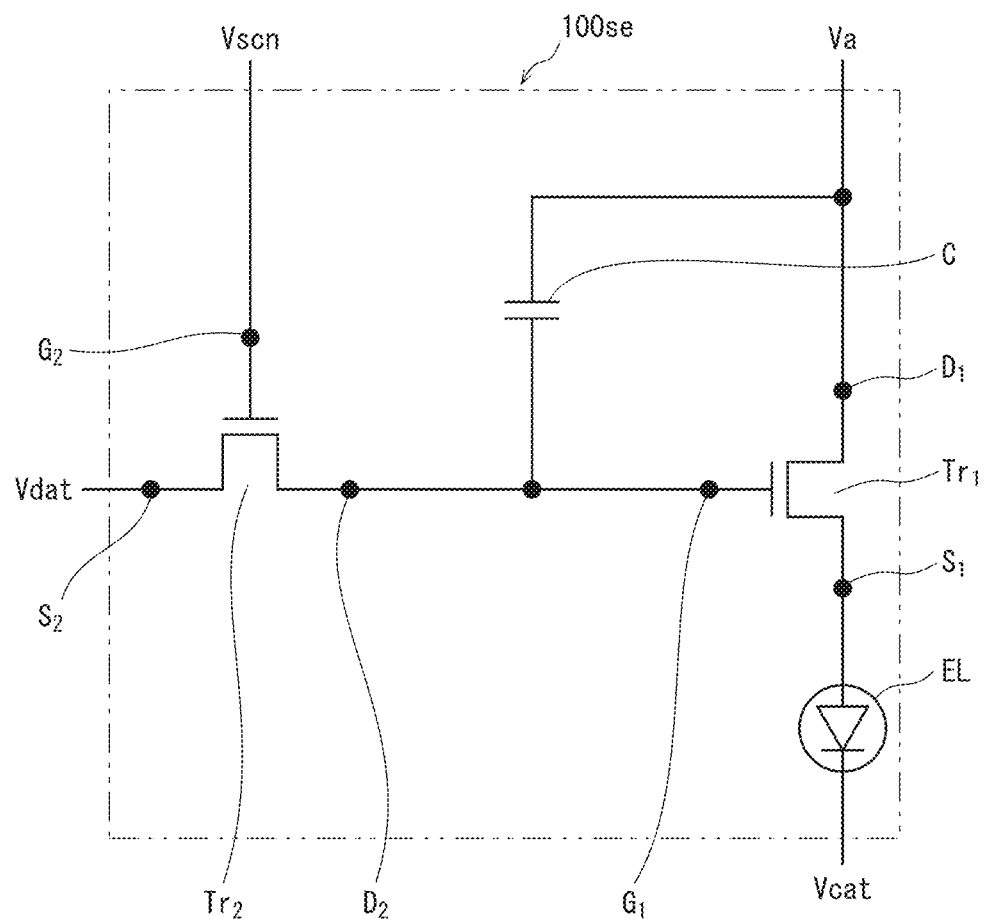
FIG. 13 is a schematic circuit diagram illustrating a circuit structure in each sub-pixel 100se of display panel 10 used in organic EL display device 1.

FIG. 13 is a circuit diagram illustrating a circuit structure of the organic EL element 100 corresponding to each of the sub-pixels 100se of the display panel 10 used in the display device 1.

As illustrated in FIG. 13, in the display panel 10 according to the present embodiment, each of the sub-pixels 100se includes two transistors $Tr_1$, $Tr_2$, a capacitor C, and an organic EL element EL as a light emitting unit. The transistor $Tr_1$ is a drive transistor and the transistor $Tr_2$ is a switching transistor.

A gate $G_2$ of the switching transistor $Tr_2$ is connected to a scan line Vscn, and a source $S_2$ is connected to a data line Vdat. A drain $D_2$ of the switching transistor $Tr_2$ is connected to a gate $G_1$ of the drive transistor $Tr_1$.

A drain $D_1$ of the drive transistor $Tr_1$ is connected to a power source line Va, and a source $S_1$ is connected to a pixel electrode (anode) of the organic EL element EL. A common electrode (cathode) of the organic EL element EL is connected to a ground line Vcat.

A first end of the capacitor C is connected to the drain $D_2$ of the switching transistor $Tr_2$ and the gate $G_1$ of the drive transistor $Tr_1$, and a second end of the capacitor C is connected to the power source line Va.

In the display panel 10, a plurality of adjacent sub-pixels 100se (for example, three sub-pixels 100se with light emission colors red (R), green (G), and blue (B)) are combined to form one unit pixel 100e, and the unit pixels 100e are distributed to form a pixel area. For each of the sub-pixels 100se, a gate line leads out from the gate $G_2$ and is connected to a scan line Vscn connected from outside the display panel. Similarly, for each of the sub-pixels 100se, a source line leads out from the source $S_2$ and is connected to the data line Vdat connected from outside the display panel.

Further, power source lines Va and ground lines Vcat of the sub-pixels 100se are aggregated and connected to a power source line and a ground line of the display device 1.

MODIFICATIONS

Although the display panel 10 is described above according to embodiments, the present disclosure is not limited to the above embodiments except in terms of essential characterizing components. For example, various modifications achievable by a person having ordinary skill in the art, and any combination of elements and functions of embodiments and modifications that do not depart from the spirit of the present invention are also included in the present disclosure. The following describes modifications of the display panel 10 as examples of such embodiments.

(1) Modification 1

The following describes a display panel pertaining to Modification 1. According to the display panel 10 pertaining to at least one embodiment, as illustrated in FIG. 3, the row banks 22X are connected to the widened portions 22a of the column banks 22Y in the sub-pixel columns CB. However, positions where the row banks 22X are connected to the column banks 22Y are not limited to the above, and may be changed as appropriate.

Figure 14A:
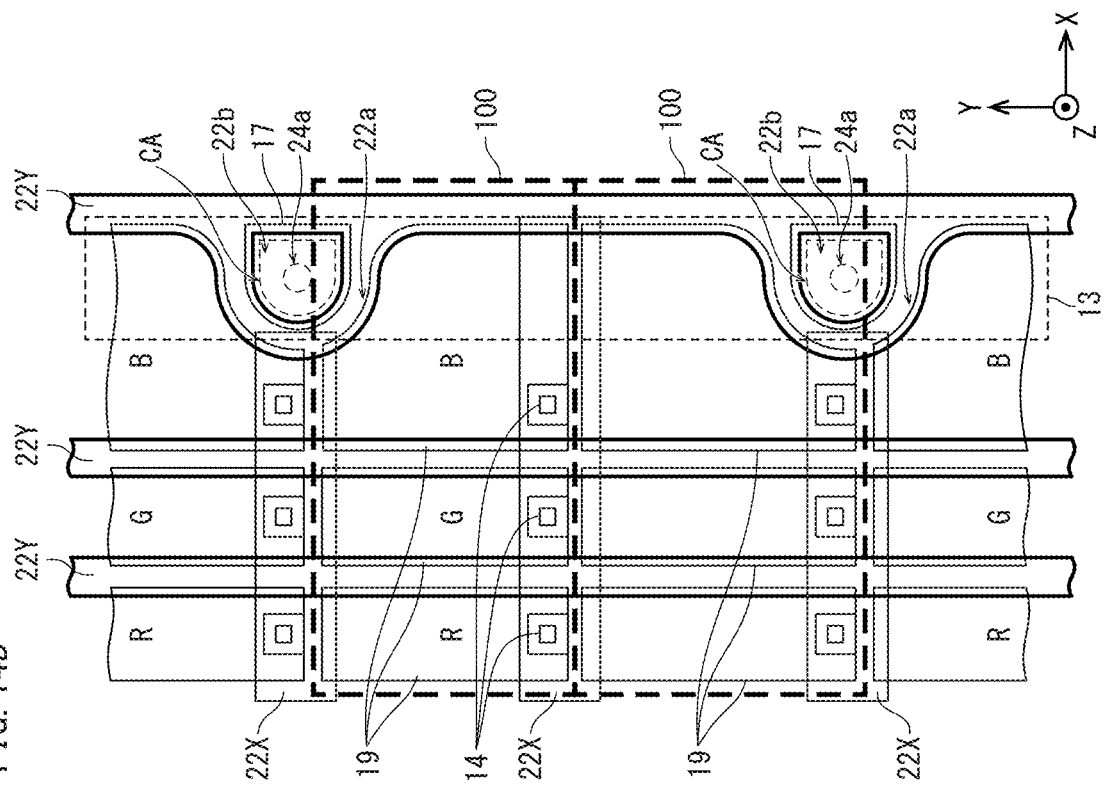
FIGS. 14A and 14B are schematic plan view enlargements of pixels of organic EL display panels according to modifications 1 and 2.

FIG. 14A is an enlarged schematic plan view diagram of pixels of a display panel according to Modification 1. According to the display panel pertaining to Modification 1, as illustrated in FIG. 14A, a structure is implemented that is different from other embodiments in that the row banks 22X are connected to the column banks 22Y in the vicinity of the widened portions 22a of the column banks 22Y in the sub-pixel columns CB, and the row banks 22X are connected to the column banks 22Y in the column direction.

According to this structure, shortening of length of the row banks 22X due to the presence of the connection areas CA can be prevented, and in forming the light emitting layers, specifically the sub-pixels 100B of the sub-pixel columns CB, length in the row direction where the row banks 22X are in contact with the ink 231 is increased, which can make film thickness of the light emitting layers 23B in the sub-pixels 100B more uniform. This can improve uniformity of luminance in the sub-pixels 100B.

(2) Modifications 2 and 3

The following describes a display panel pertaining to Modification 2. According to the display panel 10 pertaining to at least one embodiment, as illustrated in FIG. 3, all the row banks 22X are connected to the widened portions 22a of the column banks 22Y in the sub-pixel columns CB. However, positions where the row banks 22X are connected to the column banks 22Y are not limited to the above, and may be changed as appropriate.

Figure 14B:
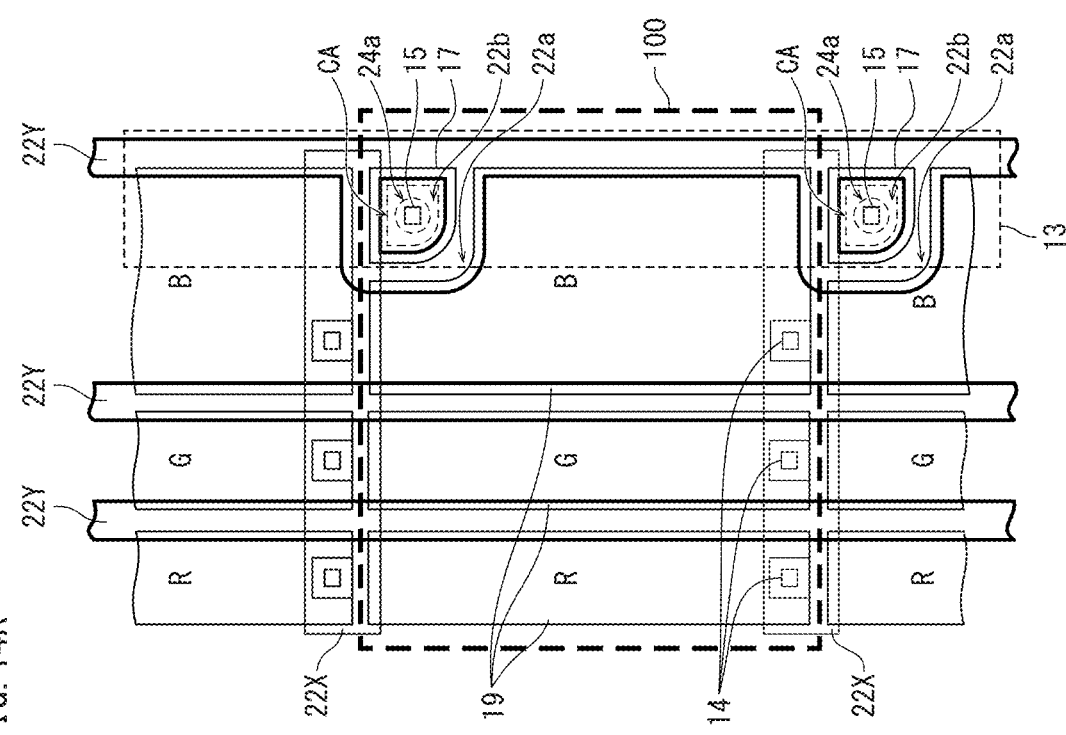

FIG. 14B is an enlarged schematic plan view diagram of pixels of a display panel according to Modification 2. The display panel according to Modification 2 is different from other embodiments in that among each plurality of pixels, in only one pixel the row bank 22X is connected to the widened portion 22a of the column 22Y. That is, the widened portions 22a of the column banks 22Y are arranged in the row direction at a pitch larger than a pitch of the pixel electrodes 19. Here, pitch refers to distance between same positions on adjacent ones of the pixel electrodes 19. According to the example illustrated in FIG. 14B, the row banks 22X are connected to the widened portions 22a of the column banks 22Y once every two pixels.

According to this structure, the number of the sub-pixels 100B in which length of the row banks 22X is shortened due to the presence of the connection areas CA in the sub-pixel columns CB can be reduced, and in forming the light emitting layers, uniformity of film thickness of the light emitting layers 23B between the sub-pixels 100B of the sub-pixel columns CB can be relatively improved. This can improve uniformity of luminance between the sub-pixels 100B of the sub-pixel columns CB.

Figure 15A:
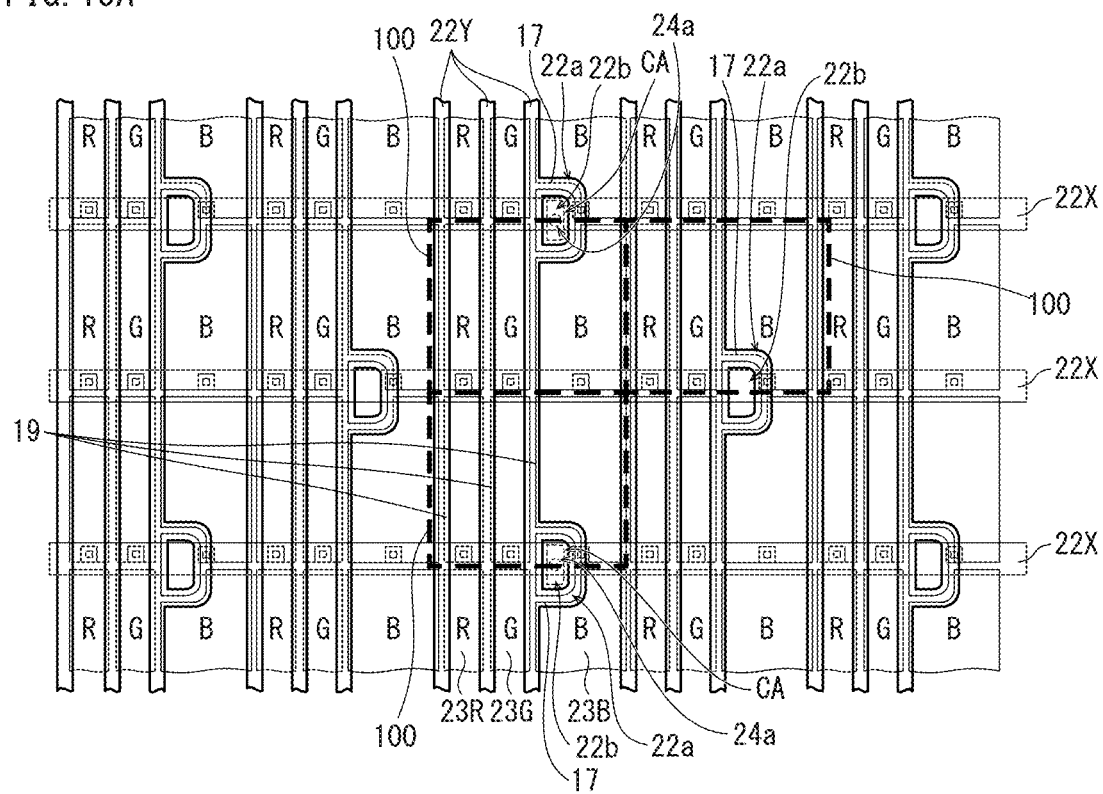
FIG. 15A is a schematic plan view enlargement of pixels of an organic EL display panel according to modification 3.
Figure 15B:
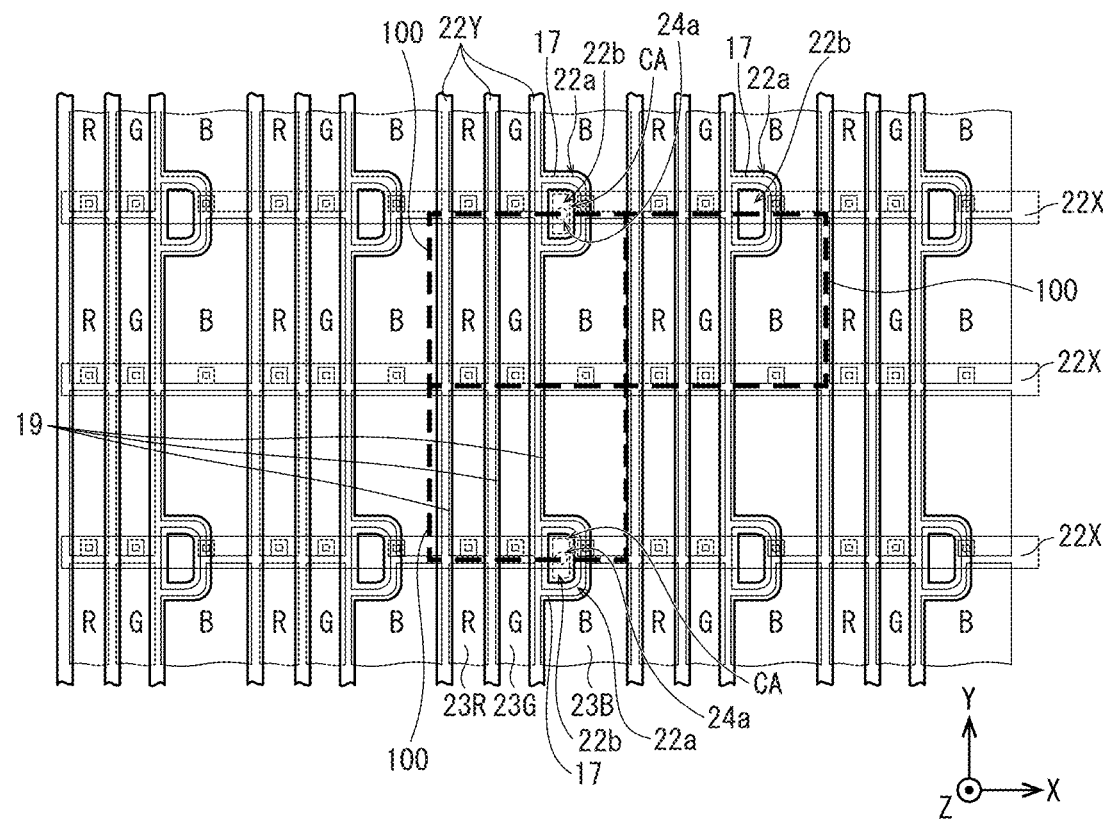
FIG. 15B is a schematic plan view enlargement of pixels of an organic EL display panel according to a reference example.

FIG. 15A is an enlarged schematic plan view diagram of pixels of an organic EL display panel according to Modification 3, while FIG. 15B is of a reference example.

According to the display panel pertaining to Modification 3, as a difference from the structure of the display panel according to Modification 2, positions in the column direction where the connection areas CA are located are different depending on position in the row direction of the sub-pixels 100B. More specifically, as illustrated in FIG. 15A, two of the column banks 22Y that are adjacent to each other in the row direction may have different positions in the column direction of the widened portions 22a, and further, two of the column banks 22Y that sandwich one of the column banks 22Y in the row direction may have the same positions in the column direction of the widened portions 22a.

According to this structure, when compared with the reference example for which the connection areas CA are located in the same position in the column direction regardless of position of the sub-pixels 100B in the row direction, position in the column direction of the connection areas CA is staggered depending on position in the row direction, and therefore it becomes more difficult to visually recognize streakiness due to distribution of luminance reduction caused by the connection areas CA in the image display area 10a.

(3) Modification 4

The following describes a display panel pertaining to Modification 4. According to the display panel 10 pertaining to at least one embodiment, as illustrated in FIG. 3, the connection areas CA are formed in the vicinity of one of each pair of the column banks 22Y either side of the gaps 22zB. However, regarding the gaps 22zB, positions in the row direction of the connection areas CA are not limited to this example, and may be appropriately changed.

FIG. 16 is an enlarged schematic plan view diagram of pixels of a display panel according to Modification 4. According to the display panel pertaining to Modification 4, as illustrated in FIG. 16, in plan view, a structure is implemented that is different from other embodiments in that the connection areas CA overlap with the row banks 22X, and are at least a defined distance separated from each of the column banks 22Y on either side in the row direction. According to the example illustrated in FIG. 16, the connection areas CA overlap the row banks 22X in plan view and are located at a center point between the column banks 22Y adjacent to each other in the row direction, separated from the column banks 22Y by a distance δX. The distance δX may be, for example, 5 μm.

According to this structure, in forming the light emitting layers, the ink 231 used in forming the sub-pixels 100B of the sub-pixel columns CB is brought into contact with the row banks 22X on both sides of the connection areas CA, which can improve fluidity of the ink 231 in the column direction of the sub-pixel columns CB, and improve uniformity of film thickness of the light emitting layers 23B between the sub-pixels 100B in the sub-pixel columns CB. This can improve uniformity of luminance between the sub-pixels 100B of the sub-pixel columns CB.

(4) Modification 5

Figure 17A:
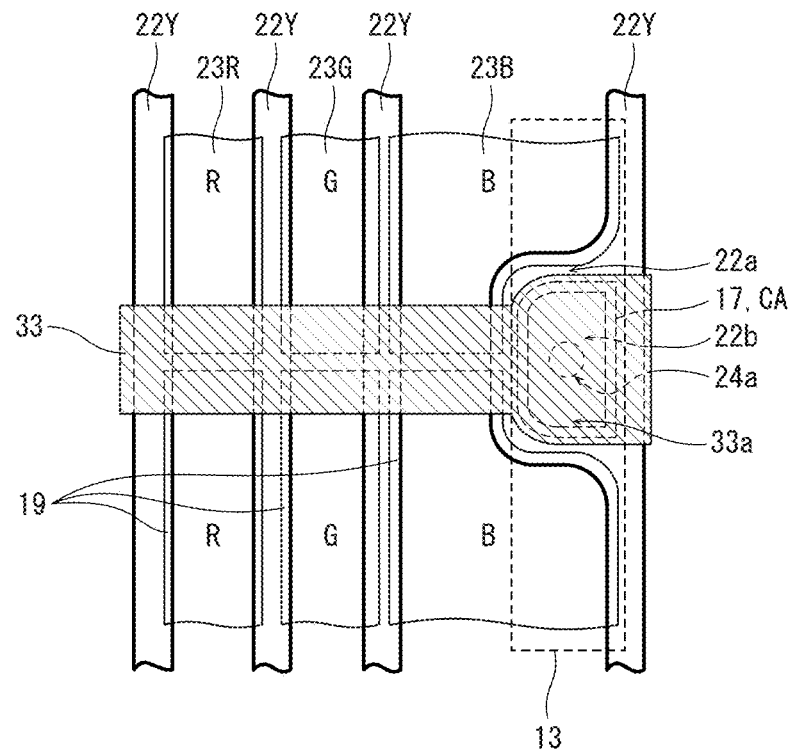
FIG. 17A is a schematic plan view enlargement of pixels of an organic EL display panel according to modification 5.
Figure 17B:
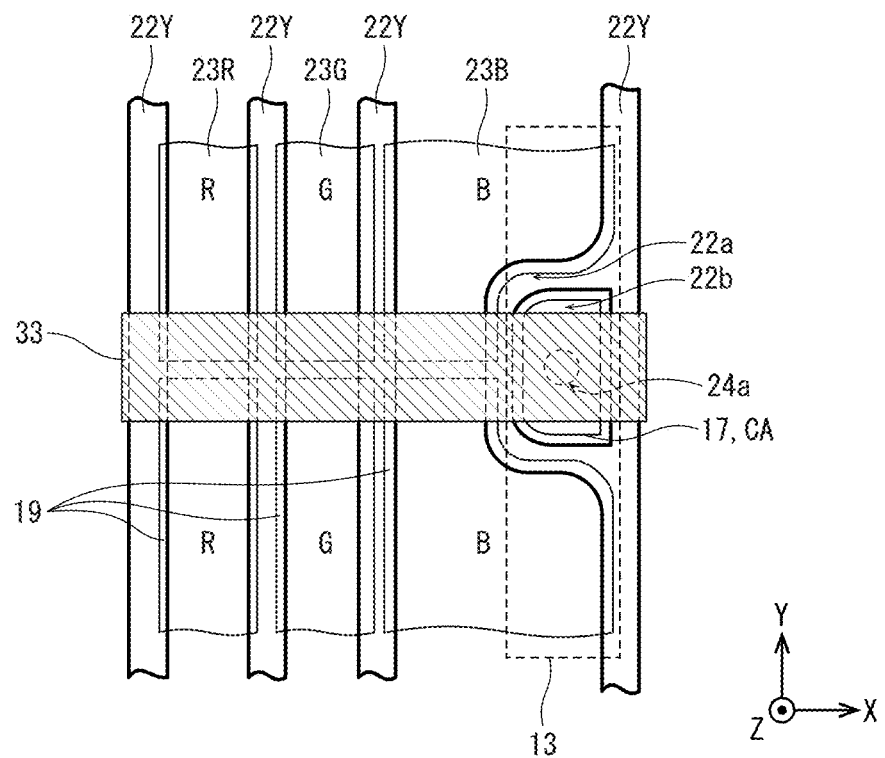
FIG. 17B is a schematic plan view enlargement of pixels of an organic EL display panel according to a reference example.

FIG. 17A is an enlarged schematic plan view diagram of pixels of an organic EL display panel according to Modification 5, while FIG. 17B is of a reference example.

According to the display panel pertaining to Modification 5, in addition to the structure of the display panel 10 according to at least one embodiment, the light shielding layer 33 at positions corresponding to boundaries between the self-luminous areas 100a of sub-pixels is different in that widened portions 33a are provided in positions above the connection areas CA so as to cover the connection areas CA in plan view. That is, the light shielding layer 33 above gaps between the pixel electrodes 19 is provided with the widened portions 33a above the connection areas CA, and covers the connection areas CA. The connecting electrodes 17 provided in the connection areas CA are metal layers made of a light reflecting metal material, similar to the pixel electrodes 19, and therefore may be a cause of glare in the display panel due to reflection of external light.

According to the display panel pertaining to Modification 5, due to the above structure, in comparison to a reference example in which portions of the connecting electrodes 17 in the connection areas CA protrude from under the light shielding layer 33 in plan view, the connecting electrodes 17 are covered by the widened portions 33a of the light shielding layer 33, and therefore even when area of the connection areas CA is increased, upwards emission of external light reflected by the connecting electrodes 17 can be prevented, and glare from reflection of external light can be reduced in the display panel 10. Note that self-emitted light is not emitted from the connection areas CA, and therefore increasing width of the light shielding layers 33 above the connection areas CA does not decrease luminance.

Other Modifications (1) According to the display panel 10 pertaining to at least one embodiment, among the sub-pixels 100R, 100G, 100B, width in the row direction of the pixel electrodes 19 corresponding to the sub-pixels 100B is larger than width in the row direction of the pixel electrodes 19 corresponding to the sub-pixels 100R, 100G, such that the self-luminous areas 100aB are larger than the self-luminous areas 100aR, 100aG, but relative width in the row direction of the pixel electrodes 19 of the sub-pixels 100 and relative area of the self-luminous areas 100a are not limited to this example.

(2) Further, according to the display panel 10, the connection areas CA are provided in the sub-pixels 100B having large self-luminous areas 100aB, but the connection areas CA may be provided in other sub-pixels 100a.

(3) According to the display panel 10 pertaining to at least one embodiment, the common electrode 25 is in contact with surfaces of the connecting electrodes 17 and hole injection layers 20 exposed by the openings 24a where portions of the electron injection transport layer 24 have been removed. Further, the connecting electrodes 17 are electrically connected to the auxiliary wiring 13 via the connecting electrode recesses 15 formed inside the contact holes of the planarizing layer 16. However, structure for electrically connecting the common electrode 25 to the auxiliary wiring 13 is not limited to this.

For example, a structure may be used in which the common electrode 25 is in direct contact with an upper surface of the auxiliary wiring 13 via contact holes of the planarizing layer 16 within the openings 22b of the column banks 22Y. As a result, the number of steps in manufacturing can be reduced without the connecting electrodes 17.

Alternatively, a structure may be used in which the hole injection layers 20 are not provided on the connecting electrodes 17. More specifically, the common electrode 25 is in contact with the surfaces of the connecting electrodes 17 exposed by the openings 24a where portions of the electron injection transport layer 24 are removed, and the connecting electrodes 17 are electrically connected to the auxiliary wiring 13 via the connecting electrode recesses 15 in the contact holes of the planarizing layer 16.

(4) According to the display panel pertaining to at least one embodiment, the auxiliary wiring 13 is located on the upper surface of the TFT layer 12 on the substrate 100x, but the location of the auxiliary wiring 13 is not limited to this. For example, the auxiliary wiring may be location within the TFT layer 12. Alternatively, as long as least a portion of the planarizing layer 16 in the thickness direction is disposed between the auxiliary wiring 13 and the pixel electrodes 19, the auxiliary wiring 13 may be disposed within the planarizing layer 16.

(5) According to the display panel 10 pertaining to at least one embodiment, colors of light emitted by the light emitting layers 23 of the sub-pixels 100*se* adjacent in the row direction in the gaps 22*z* between the column banks 22Y are configured to be different, while color of light emitted by the light emitting layers 23 of the sub-pixels 100*se* adjacent in the column direction in gaps between the row banks 22X is the same. However, in the above structure, color of light emitting by the light emitting layers 23 of the sub-pixels 100*se* adjacent in the row direction may be the same, and colors of light emitted by the light emitting layers 23 of the sub-pixels 100*se* adjacent in the column direction may be different.

According to the display panel 10, the pixels 100 have three different types: red pixels, green pixels, and blue pixels, but the present invention is not limited to this. For example, there may be one type of light emitting layer, or there may be four types that emit red, green, blue, and white light.

(6) According to at least one embodiment, the unit pixels 100*e* are arranged in a matrix, but the present invention is not limited to this. For example, when an interval between pixel regions is one pitch, a structure in which pixel areas are shifted by half a pitch in the column direction in adjacent gaps is also effective. As advances in high definition are made in display panels, it becomes difficult visually discriminate slight deviations in the column direction, such that even if film thickness unevenness is lined up in a straight line (or staggered line) having a certain width, it will appear as banding. Accordingly, even in such a case, display quality of a display panel can be improved by suppressing uneven luminance by arrangement of pixels in a staggered pattern.

(7) According to at least one embodiment, the hole injection layers 20, the hole transport layers 21, the light emitting layers 23, and the electron injection transport layer 24 are present between the pixel electrodes 19 and the common electrode 25, but the present invention is not limited to this. For example, a structure may be implemented in which the hole injection layers 20, the hole transport layers 21, and the electron injection transport layer 24 are not used, and only the light emitting layers 23 are present between the pixel electrodes 19 and the common electrode 25. Further, for example, a structure may be implemented in which hole injection layers, hole transport layers, an electron injection transport layer, an electron injection layer, or the like are provided, or a plurality or all of these are provided. Further, all of these layers do not have to be made of organic compounds, and may be made of inorganic compounds or the like.

Further, according to at least one embodiment, the light emitting layers 23 are formed by using a wet film-forming process such as a printing method, a spin coating method, an inkjet method, or the like, but the present invention is not limited to this. For example, a dry film forming process such as a vacuum vapor deposition method, an electron beam vapor deposition method, a sputtering method, a reactive sputtering method, an ion plating method, or a vapor phase growth method can be used. Further, as materials of each constituent part, a known material can be adopted as appropriate.

(8) According to at least one embodiment, the pixel electrodes 19 are disposed as anodes at a lower portion of the organic EL elements, and connected to wiring connected to source electrodes of TFTs, but it is also possible to adopt a structure in which a common electrode is disposed at the lower portion and anodes are disposed at an upper portion. In such a case, the cathode disposed at the lower portion is connected to a drain of a TFT.

(9) According to at least one embodiment, a top emission type of EL display panel is used as an example, but the present invention is not limited to this. For example, a bottom emission type of display panel or the like can be implemented. In such a case, each structure can be modified as appropriate.

(10) At least one embodiment described above is an organic EL display panel using organic EL elements as self-luminous elements, but display panels such a quantum dot display panel using quantum dot light emitting elements (quantum dot light emitting diodes; QLED) are different only in light emitting layer structure and type, and structure of a light emitting layer between a pixel electrode and a counter electrode, and other functional layers interposed, are the same as an organic EL display panel, and therefore the present invention can be applied.

Supplement

Embodiments described above each illustrate a preferred specific example of the present invention. Numerical values, shapes, materials, components, positions and connections of components, processes, order of processes, and the like are merely examples, and are not intended to limit the present invention. Further, among components described for embodiments, components not described in independent claims describing the highest level concepts of the present invention are described as components constituting a more preferred embodiment.

Further, the order in which steps are executed is described for the purpose of illustrating the present invention in detail, and a different order may be used. Further, some steps may be executed at the same time (in parallel) as other steps.

Further, components in each drawing referenced in description of the embodiments are not necessarily drawn to scale, and are illustrative for the sake of facilitating understanding of the invention. Further, the present invention is not limited to the description of the embodiments, and can be modified as appropriate within the scope of the present invention.

Further, at least a portion of the functions of each embodiment and modifications thereof may be combined.

Further, the present invention also includes various modifications within a range that can be conceived by a person skilled in the art.

What is claimed is:

1. A self-luminous display panel comprising:
a substrate;
auxiliary wiring disposed on the substrate;
pixel electrodes disposed in a matrix of rows and columns above the substrate with defined gaps between the pixel electrodes;
light emitting layers disposed above the pixel electrodes;
a functional layer disposed above the light emitting layers, the functional layer being continuous across the light emitting layers; and
a common electrode disposed above the functional layer, the common electrode being continuous across the functional layer, wherein
the auxiliary wiring extends in plane directions of a main surface of the substrate below a first part of the pixel electrodes above the substrate, connection areas exist where the pixel electrodes are not present, in which the common electrode and the auxiliary wiring are electrically connected to each other, and in plan view, portions of outer edges of the pixel electrodes facing outer edges of the connection areas are recessed inwards of the pixel electrodes, wherein in a first portion, the outer edge of the pixel electrode is recessed inward, and the first portion overlaps with the auxiliary wiring, which forms a self-luminous region due to the light-emitting layer above the pixel electrode.

2. The self-luminous display panel of claim 1, wherein portions of the functional layer above the connection areas are removed to create openings, and the common electrode is in contact with the auxiliary wiring or electrodes or a layer electrically connected to the auxiliary wiring exposed by the openings in the functional layer.

3. The self-luminous display panel of claim 1, further comprising:

column banks disposed above gaps between the pixel electrodes, the column banks extending in a column direction and arranged side by side, wherein the auxiliary wiring extends in a row direction and/or the column direction in plan view of the substrate, the light emitting layers are disposed in gaps between the column banks so as to be continuous in any given gap above a plurality of the pixel electrodes, some or all of the column banks include widened portions that include the connection areas in plan view, and the widened portions each have a shape in which an opening is provided that penetrates through the widened portion in a height direction and includes one of the openings of the functional layer in plan view.

4. The self-luminous display panel of claim 3, further comprising:

row banks disposed above gaps between the pixel electrodes, the row banks extending in the row direction, arranged side by side, and connected to the column banks, wherein the row banks are connected to the widened portions of the column banks.

5. The self-luminous display panel of claim 3, wherein the widened portions of the column banks are arranged in the column direction at a pitch larger than a pitch of the pixel electrodes.

6. The self-luminous display panel of claim 5, wherein among the column banks that include widened portions, positions of the widened portions in the column direction are different for any two of the column banks that are adjacent to each other in the row direction.

7. The self-luminous display panel of claim 6, wherein positions of the widened portions in the column direction are the same for any two of the column banks that include widened portions and sandwich in the row direction another one of the column banks that includes widened portions.

8. The self-luminous display panel of claim 3, further comprising:

row banks disposed above gaps between the pixel electrodes, the row banks extending in the row direction, arranged side by side, and connected to the column banks, wherein in plan view, the connection areas overlap with the row banks and are separated from the column banks by at least a defined distance.

9. The self-luminous display panel of claim 1, further comprising:

a light shielding layer disposed above and covering the gaps between the pixel electrodes, wherein the light shielding layer includes widened portions covering the connection areas in plan view.

10. The self-luminous display panel of claim 1, wherein in plan view, outer edges of the pixel electrodes around the connection areas are arranged to face the outer edges of the connection areas in the row direction and the column direction.

* * * * *